US011649377B2

(12) United States Patent
Hanano et al.

(10) Patent No.: US 11,649,377 B2
(45) Date of Patent: May 16, 2023

(54) POLISHING LIQUID, POLISHING LIQUID SET AND POLISHING METHOD

(71) Applicant: HITACHI CHEMICAL COMPANY, LTD., Tokyo (JP)

(72) Inventors: Masayuki Hanano, Tokyo (JP); Toshio Takizawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/638,493

(22) PCT Filed: Aug. 14, 2017

(86) PCT No.: PCT/JP2017/029288
§ 371 (c)(1),
(2) Date: Feb. 12, 2020

(87) PCT Pub. No.: WO2019/035161
PCT Pub. Date: Feb. 21, 2019

(65) Prior Publication Data
US 2020/0299544 A1 Sep. 24, 2020

(51) Int. Cl.
*C09G 1/02* (2006.01)
*C09K 13/06* (2006.01)
(Continued)

(52) U.S. Cl.
CPC ............... *C09G 1/02* (2013.01); *C09K 13/06* (2013.01); *H01L 21/31053* (2013.01); *H01L 21/30625* (2013.01)

(58) Field of Classification Search
CPC .. C09G 1/02; C09K 13/06; C09K 3/14; H01L 21/31053; H01L 21/30625
See application file for complete search history.

(56) References Cited

U.S. PATENT DOCUMENTS 8,591,612 B2 * 11/2013 Enomoto ................. C09G 1/02
51/307
2007/0175104 A1 * 8/2007 Nishiyama ........ H01L 21/31053
51/307
(Continued)

FOREIGN PATENT DOCUMENTS

JP H10-106994 A 4/1998
JP 3278532 A 4/2002
(Continued)

OTHER PUBLICATIONS

English machine translation of JP 6783609B2 "Metal Oxide Particle Dispersion" Nov. 11, 2020. (Year: 2020).*

*Primary Examiner* — Shamim Ahmed
(74) *Attorney, Agent, or Firm* — Fitch, Even, Tabin & Flannery, L.L.P.

(57) ABSTRACT

Provided is a CMP polishing liquid used for removing a part of an insulating portion of a base substrate, which includes a substrate, a stopper provided on one surface of the substrate, and the insulating portion provided on a surface of the stopper opposite to the substrate, by CMP to expose the stopper, the polishing liquid containing: abrasive grains containing cerium; a nonionic water-soluble compound A; a polymer compound B having at least one selected from the group consisting of carboxylic acid groups and carboxylate groups; a basic pH adjusting agent which is optionally contained; and water, in which a content of the basic pH adjusting agent is less than $1.3 \times 10^{-2}$ mol/kg based on the total mass of the polishing liquid.

20 Claims, 4 Drawing Sheets

(51) Int. Cl.
  *H01L 21/306*  (2006.01)
  *H01L 21/3105* (2006.01)

(56) References Cited

U.S. PATENT DOCUMENTS

| | | | |
|---|---|---|---|
| 2008/0003925 A1* | 1/2008 | Fukasawa | C09G 1/02 |
| | | | 451/37 |
| 2013/0260558 A1* | 10/2013 | Oota | H01L 21/30625 |
| | | | 438/693 |
| 2015/0376464 A1* | 12/2015 | Tsuchiya | B24B 37/044 |
| | | | 252/79.1 |
| 2017/0166780 A1* | 6/2017 | Kwon | C09K 3/1436 |
| 2017/0210958 A1* | 7/2017 | Shinoda | B24B 1/00 |
| 2020/0032106 A1* | 1/2020 | Iwano | C09K 13/00 |

FOREIGN PATENT DOCUMENTS

| | | | |
|---|---|---|---|
| JP | 2009212378 A * | 9/2009 | |
| JP | 2010192556 A * | 9/2010 | |
| JP | 2011-181946 A | 9/2011 | |
| JP | 2017-110177 B | 6/2017 | |
| JP | 2017-110219 A | 6/2017 | |
| JP | 2018053138 A * | 4/2018 | |
| KR | 10-2014-0039143 A | 4/2014 | |
| TW | 201229222 A1 | 7/2012 | |
| WO | 2008/032794 A1 | 3/2008 | |

\* cited by examiner (A)

(B)

POLISHING LIQUID, POLISHING LIQUID SET AND POLISHING METHOD

CROSS-REFERENCE TO RELATED APPLICATIONS

This application is a U.S. national phase application filed under 35 U.S.C. § 371 of International Application No. PCT/JP2017/029288, filed Aug. 14, 2017, designating the United States, which is hereby incorporated herein by reference in its entirety.

TECHNICAL FIELD

The present invention relates to a polishing liquid, a polishing liquid set, and a polishing method.

BACKGROUND ART

In recent years, research and development of processing techniques for increasing the density and miniaturization of semiconductor elements in manufacturing processes of ULSI semiconductor elements have been advanced. A chemical mechanical polishing (CMP) technique that is one of the processing techniques becomes an essential technique when a flattening step of interlayer insulating films, a formation step of shallow trench isolation (hereinafter, referred to as "STI"), a formation step of plugs, a formation step of buried metal wiring (damascene step), and the like are performed in manufacturing processes of semiconductor elements. The flattening step using the CMP technique (hereinafter, referred to as "CMP step") is generally performed by polishing a portion to be polished while supplying a polishing liquid between a polishing pad (polishing cloth) and the portion to be polished (for example, an insulating portion) on a base substrate.

As a polishing liquid for CMP (hereinafter, referred to as "CMP polishing liquid"), various polishing liquids are known. The CMP polishing liquid is classified, for example, by types of abrasive grains (abrasive particles) contained in the polishing liquids. As the CMP polishing liquid, a ceria-based polishing liquid containing cerium oxide (ceria) particles as abrasive grains, a silica-based polishing liquid containing silicon oxide (silica) particles as abrasive grains, an alumina-based polishing liquid containing aluminum oxide (alumina) particles as abrasive grains, a resin particle-based polishing liquid containing organic resin particles as abrasive grains, and the like are known.

In manufacturing processes of semiconductor elements, as a polishing liquid for polishing an insulating portion containing an insulating material such as silicon oxide or carbon-containing silicon oxide, the ceria-based polishing liquid is attracting attention in terms of having a higher polishing rate with respect to the insulating material than that of the silica-based polishing liquid.

As the ceria-based polishing liquid, a CMP polishing liquid using high-purity cerium oxide abrasive grains is known (for example, Patent Literature 1 described below). Further, Patent Literature 2 discloses a technique of adding an organic compound with a molecular weight of 100 or more having at least one hydrophilic group in order to control a polishing rate of the ceria-based polishing liquid and improve flatness. Furthermore, it is known that, when a polymer obtained by polymerizing a monomer including at least one of a carboxylic acid having an unsaturated double bond and a salt thereof using a reducing inorganic acid salt and oxygen as a redox polymerization initiator is used as an additive in the polishing liquid containing cerium oxide particles, uniform polishing with little influence from the density difference of wiring patterns can be achieved (for example, Patent Literature 3 described below).

In the CMP step, the insulating portion may be selectively polished using a stopper (for example, a single-crystal silicon film, a polysilicon film, an amorphous silicon film, or the like). For example, a laminate body, which has a substrate having a concavo-convex pattern on one surface, a stopper disposed on convex portions of the substrate (a polishing stop layer formed from a stopper material), and an insulating portion (portion to be polished) formed from an insulating material and disposed on the substrate and the stopper so as to fill concave portions of the concavo-convex pattern, is polished.

CITATION LIST

Patent Literature

Patent Literature 1: Japanese Unexamined Patent Publication No. H10-106994
Patent Literature 2: Japanese Patent No. 3278532
Patent Literature 3: International Publication WO 2008/032794

SUMMARY OF INVENTION

Technical Problem

Incidentally, in the technique of selectively polishing the insulating portion using the stopper, for increasing the density and miniaturization of semiconductor elements, it is required to further increase a ratio of a polishing rate of an insulating material to a polishing rate of a stopper material (the polishing rate of the insulating material/the polishing rate of the stopper material; hereinafter, also simply referred to as "polishing rate ratio R") while suppressing the polishing rate of the stopper material. However, in the case of using a polishing liquid that can obtain a high polishing rate ratio R, defects such as scratches and holes (recessed defects) may occur in the stopper after the CMP step. Since the above-described stopper is also used as a conductive portion constituting a gate electrode or the like of a transistor, in the case of recessed defects occurring, the recessed defects greatly affect the reliability of semiconductor elements. From such reasons, the CMP polishing liquid is required to be able to stop the polishing of the insulating portion without polishing the stopper when the stopper is exposed, and to suppress the occurrence of the defects as described above in the stopper.

In this regard, an object of the present invention is to provide a polishing liquid which is excellent in the ratio of the polishing rate of the insulating material to the polishing rate of the stopper material and is capable of suppressing the occurrence of recessed defects in the stopper, a polishing liquid set for obtaining the polishing liquid, and a polishing method using the polishing liquid.

Solution to Problem

The present inventors have conducted intensive studies on a CMP polishing liquid in order to solve the above problems. As a result, the present inventors have found that, by adjusting a content of a basic pH adjusting agent to be less than a predetermined amount in a CMP polishing liquid, which contains abrasive grains containing cerium, a nonionic water-soluble compound A, and a polymer compound B having at least one selected from the group consisting of carboxylic acid groups and carboxylate groups, both an excellent polishing rate ratio R and suppression of the occurrence of recessed defects in the stopper can be achieved, thereby completing the present invention.

An aspect of the present invention relates to a polishing liquid used for removing a part of an insulating portion of a base substrate, which includes a substrate, a stopper provided on one surface of the substrate, and the insulating portion provided on a surface of the stopper opposite to the substrate, by CMP to expose the stopper. This polishing liquid contains abrasive grains containing cerium, a nonionic water-soluble compound A, a polymer compound B having at least one selected from the group consisting of carboxylic acid groups and carboxylate groups, a basic pH adjusting agent which is optionally contained, and water. In this polishing liquid, a content of the basic pH adjusting agent is less than $1.3 \times 10^{-2}$ mol/kg based on the total mass of the polishing liquid. According to this polishing liquid, the polishing rate ratio R is excellent and the occurrence of recessed defects in the stopper can be suppressed. That is, according to the polishing liquid, it is possible to suppress the occurrence of recessed defects in the stopper while increasing a polishing rate ratio of an insulating material with respect to a stopper material in a CMP technique of polishing an insulating portion of a base substrate which includes a substrate, a stopper provided on one surface of the substrate (for example, a polishing stop layer formed from a stopper material such as polysilicon), and the insulating portion provided on a surface of the stopper opposite to the substrate (for example, an insulating film formed from an insulating material such as silicon oxide or carbon-containing silicon oxide; an interlayer insulating film such as an STI film or a BPSG film (a silicon dioxide film doped with boron and phosphorus)).

In an embodiment, the abrasive grains may contain cerium oxide.

In an embodiment, a pH of the polishing liquid may be 6.0 or less or may be 5.0 or more.

In an embodiment, a content of the polymer compound B may be 0.35% by mass or less or may be 0.05% by mass or more based on the total mass of the polishing liquid.

In an embodiment, when a pH of the polishing liquid is designated as x and a content of the polymer compound B based on the total mass of the polishing liquid is designated as y, a relation of $y \geq 0.33x - 1.7$ may be satisfied.

In an embodiment, a content of the water-soluble compound A may be 0.005 to 0.3% by mass based on the total mass of the polishing liquid.

In an embodiment, a content of the basic pH adjusting agent may be less than $5.0 \times 10^{-3}$ mol/kg based on the total mass of the polishing liquid.

In an embodiment, a content of the abrasive grains may be 0.2 to 5% by mass based on the total mass of the polishing liquid.

In an embodiment, the polishing liquid may further contain at least one organic acid component selected from the group consisting of organic acids and organic acid salts.

In an embodiment, the stopper may contain at least one stopper material selected from the group consisting of polysilicon, amorphous silicon, and single-crystal silicon.

In an embodiment, the polishing liquid may be stored as a two-pack type polishing liquid configured by a first liquid containing the abrasive grains and water and a second liquid containing the water-soluble compound A, the polymer compound B, and water. In this embodiment, the basic pH adjusting agent may be contained in at least one of the first liquid and the second liquid.

Another aspect of the present invention relates to a polishing liquid set containing constituent components of the above-described polishing liquid stored while being divided into a first liquid and a second liquid, the first liquid containing the abrasive grains and water, the second liquid containing the water-soluble compound A, the polymer compound B, and water.

Still another aspect of the present invention relates to a polishing method including a step of removing a part of the insulating portion of the base substrate by CMP using the above-described polishing liquid or a polishing liquid obtained by mixing the first liquid and the second liquid in the above-described polishing liquid set to expose the stopper. According to this polishing method, it is possible to suppress the occurrence of recessed defects in the stopper. Further, in this polishing method, an excellent polishing rate ratio R tends to be obtainable.

Advantageous Effects of Invention

According to the present invention, it is possible to provide a polishing liquid which is excellent in the ratio of the polishing rate of the insulating material to the polishing rate of the stopper material and is capable of suppressing the occurrence of recessed defects in the stopper, a polishing liquid set for obtaining the polishing liquid, and a polishing method using the polishing liquid. According to the present invention, it is possible to provide use of a polishing liquid in a flattening step of the base substrate surface that is a technique of manufacturing a semiconductor element (for example, a flattening step of an interlayer insulating film such as a BPSG film, or a formation step of STI).

DESCRIPTION OF EMBODIMENTS

Figure 1:
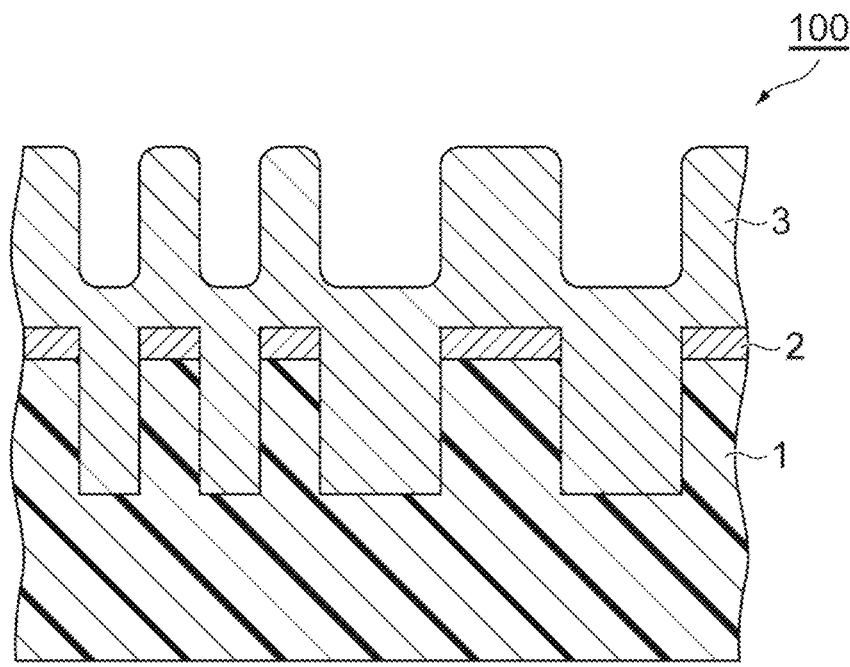
FIG. 1 is a schematic cross-sectional view illustrating a polishing method of an embodiment of the present invention.
Figure 1:
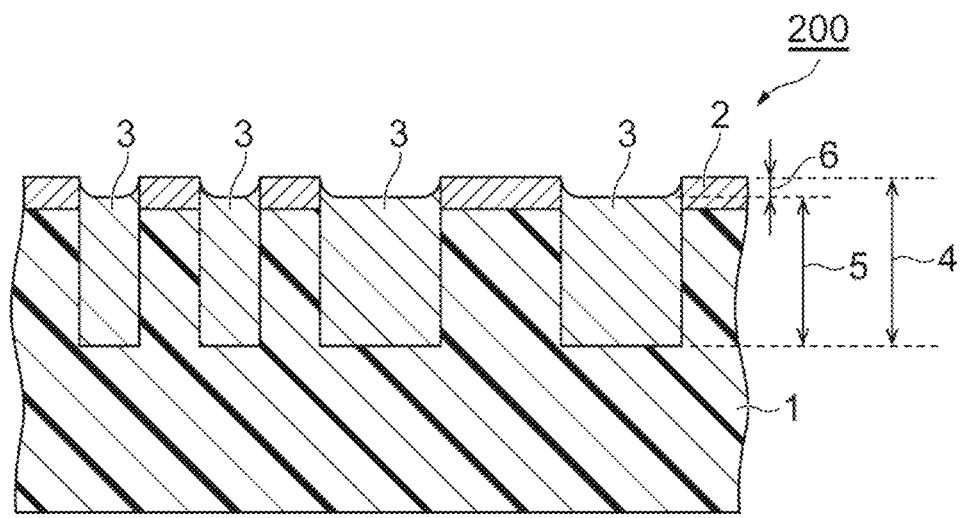

Hereinafter, an embodiment of the present invention will be described in detail.

Polishing Liquid

A polishing liquid of an embodiment is a polishing liquid (CMP polishing liquid) used for removing a part of an insulating portion of a base substrate, which includes a substrate, a stopper provided on one surface of the substrate, and the insulating portion provided on a surface of the stopper opposite to the substrate, by CMP to expose the stopper, the polishing liquid containing abrasive grains containing cerium, a nonionic water-soluble compound A, a polymer compound B having at least one selected from the group consisting of carboxylic acid groups and carboxylate groups, a basic pH adjusting agent which is optionally contained, and water. The content of the basic pH adjusting agent in the polishing liquid of the present embodiment is less than $1.3 \times 10^{-2}$ mol/kg based on the total mass of the polishing liquid.

According to the polishing liquid of the present embodiment, it is possible to achieve both an excellent polishing rate ratio R (a polishing rate of an insulating material/a polishing rate of a stopper material) and suppression of the occurrence of recessed defects in a stopper.

Incidentally, in the case of using the polishing liquid that can obtain a high polishing rate ratio R for increasing the density and miniaturization of semiconductor elements, the insulating portion is excessively polished so that scrapping, which is called dishing, of the insulating portion may occur. Meanwhile, as a result of studies of the present inventors, it became clear that in a case where a pH (x) of the polishing liquid and a content (y) of the polymer compound B based on the total mass of the polishing liquid satisfy a relation of y≥0.33x−0.133 in the polishing liquid of the present embodiment, a dishing amount (recess amount), wiring density dependence, or the like is easily reduced and the surface flatness (flatness of the surface after polishing) is easily improved.

That is, in the present embodiment, it is preferable to satisfy the relation of y≥0.33x−1.7 from the viewpoints of reducing the dishing amount, the wiring density dependence, or the like and improving the surface flatness while achieving both an excellent polishing rate ratio R (the polishing rate of the insulating material/the polishing rate of the stopper material) and suppression of the occurrence of recessed defects in the stopper. From the viewpoint that the above effects become remarkable, the pH (x) of the polishing liquid is preferably 4.0 to 6.0, more preferably 4.5 to 6.0, further preferably 4.7 to 6.0, particularly preferably 5.0 to 6.0, extremely preferably 5.0 to 5.8, even more preferably 5.0 to 5.7, and very preferably 5.0 to 5.6. From the viewpoint that the above effects become remarkable, the content (y) of the polymer compound B is preferably 0.001 to 2% by mass, more preferably 0.01 to 1% by mass, further preferably 0.05 to 0.5% by mass, particularly preferably 0.05 to 0.35% by mass, extremely preferably 0.05 to 0.25% by mass, and even more preferably 0.1 to 0.25% by mass.

Hereinafter, constituent components of the polishing liquid of the present embodiment will be described in detail.

Abrasive Grains

The abrasive grains contain cerium from the viewpoint of obtaining a polishing effect with respect to an insulating material (for example, silicon oxide, carbon-containing silicon oxide, or the like). Incidentally, in the present specification, the "abrasive grains" means particles contained in the polishing liquid or a set thereof, and are also referred to as "abrasive particles." The abrasive grains are generally solid particles. In polishing using the abrasive grains, it is considered that an object to be removed is removed by the mechanical action of the abrasive grains and the chemical action of the abrasive grains (mainly, the surface of the abrasive grains), but the polishing mechanism using the abrasive grains is not limited thereto.

Examples of constituent components of the abrasive grains containing cerium include cerium oxide (ceria), cerium hydroxide, cerium ammonium nitrate, cerium acetate, cerium sulfate hydrate, cerium bromate, cerium bromide, cerium chloride, cerium oxalate, cerium nitrate, cerium carbonate, and cerium-modified products. In other words, the polishing liquid of the present embodiment may contain particles containing the aforementioned components (cerium oxide, cerium hydroxide, and the like) as the abrasive grains containing cerium. Examples of particles containing cerium-modified products include particles in which surfaces of particles containing cerium oxide, cerium hydroxide, or the like is modified with an alkyl group, and composite particles in which other particles are attached to surfaces of particles containing cerium. The abrasive grains preferably contain at least one selected from the group consisting of cerium oxide and cerium hydroxide and more preferably contain cerium oxide, from the viewpoint of obtaining effects of easily reducing the dishing amount by stabilizing the polishing rate of the insulating material, and the like.

The particles containing cerium oxide (hereinafter, referred to as "cerium oxide particles") are not particularly limited, and known particles can be used. Preferred cerium oxide particles are particles obtained by oxidizing cerium salts such as carbonates, nitrates, sulfates, and oxalates. Examples of the oxidation method include a firing method in which a cerium salt is fired at about 600 to 900° C. and a chemical oxidation method in which a cerium salt is oxidized using an oxidizing agent such as hydrogen peroxide. As the method for producing the cerium oxide particles, the firing method is preferred from the viewpoint of easily obtaining a high polishing rate of an insulating material, and the chemical oxidation method is preferred from the viewpoint that polishing scratches hardly occur on the surface after polishing.

In the case of using the cerium oxide particles, as the crystallite diameter of the cerium oxide particles (diameter of crystallites) is large and crystal distortion is small (that is, the crystallinity is favorable), high-speed polishing is possible, but polishing scratches are easily generated on a surface to be polished (for example, the stopper and the insulating portion). From such a viewpoint, as preferred cerium oxide particles, particles composed of two or more crystallites and having crystal grain boundaries are exemplified. Particularly, particles having a crystallite diameter of 5 to 300 nm are more preferred. Further, as other preferred cerium oxide particles, colloidal ceria particles having a crystallite diameter of 5 to 300 nm (for example, colloidal ceria manufactured by Rhodia) are exemplified.

The average particle diameter of the abrasive grains is preferably 10 nm or more, more preferably 20 nm or more, and further preferably 50 nm or more, from the viewpoint of obtaining a further favorable polishing rate with respect to the insulating material. The average particle diameter of the abrasive grains is preferably 500 nm or less, more preferably 400 nm or less, and further preferably 300 nm or less, from the viewpoints of hardly damaging the surface to be polished (for example, a stopper and an insulating portion) and easily suppressing the occurrence of recessed defects. From these viewpoints, the average particle diameter of the abrasive grains is preferably 10 to 500 nm, more preferably 20 to 400 nm, and further preferably 50 to 300 nm.

Herein, the average particle diameter of the abrasive grains means a value of D50 (median diameter of volumetric distribution, cumulative median value) of a measurement sample as measured using a laser diffraction type particle size distribution meter Mastersizer Microplus (manufactured by Malvern Panalytical Ltd., trade name ("Mastersizer" is the registered trademark)) at a refractive index of 1.93 and absorption of 0. In measurement of the average particle diameter, a sample having an appropriate content (for example, a content at which a transmittance (H)

becomes 60 to 70% as measured with respect to He—Ne laser) is used. Further, in the case of storing the polishing liquid containing the abrasive grains while being divided into a cerium slurry in which the abrasive grains are dispersed in water, and an additive liquid, the measurement can be carried out by diluting the cerium slurry to an appropriate content.

The abrasive grains may contain components other than cerium. Examples of components other than cerium include at least one selected from the group consisting of silica, alumina, zirconia, manganese oxide, magnesium oxide, titania, germania, resin, diamond, silicon carbide, cubic boron nitride, and modified products thereof In other words, the polishing liquid of the present embodiment may contain particles containing the above-described components (for example, silica, alumina, and the like) as the abrasive grains. As particles containing alumina, colloidal alumina can also be used. Examples of particles containing the above-described modified products include particles in which surfaces of particles containing silica, alumina, zirconia, titania, germania, manganese oxide, magnesium oxide, or the like are modified with an alkyl group and composite particles in which other particle is attached to the surface of one particle. The abrasive grains can be used singly or in combination of two or more kinds thereof.

The abrasive grains may be abrasive grains obtained by any producing method. For example, as the method of producing an oxide, a solid phase method using firing or the like; a liquid phase method such as a precipitation method, a sol-gel method, or a hydrothermal synthesis method; a gas phase method such as a sputtering method, a laser method, or a thermal plasma method, and the like can be used.

In a case where the abrasive grains are aggregated, the aggregated abrasive grains may be subjected to mechanical pulverization. As a pulverization method, for example, a dry pulverization method using a jet mill or the like and a wet pulverization method using a planetary bead mill or the like are preferred. In the jet mill, for example, a method described in "Kagaku Kougaku Ronbunshu (Collection of chemical engineering papers)," Vol. 6, No. 5, (1980), pp. 527 to 532 can be applied.

In the case of applying the abrasive grains to the polishing liquid, preferably, the abrasive grains are dispersed in water, which is a main dispersing medium, to obtain a polishing liquid. As a dispersion method, for example, in addition to a dispersion treatment by a general stirrer, methods using a homogenizer, an ultrasonic dispersing machine, a wet ball mill, and the like are exemplified. As for the dispersion method and a particle controlling method, for example, methods described in Chapter 3 "Latest development trend and selection guidelines for various dispersing machines" of "Encyclopedia of Dispersion Technology" [Johokiko Co., Ltd., July 2005] can be used. Further, the dispersibility of the abrasive grains can also be increased by lowering an electric conductivity of the dispersion containing the abrasive grains (for example, 500 mS/m or less). Examples of the method of lowering the electric conductivity of the dispersion include a method in which solid-liquid separation is performed by centrifugal separation in order to separate the abrasive grains from the dispersing medium, the supernatant liquid (dispersing medium) is discarded, and redispersion is performed by addition of a dispersing medium having a low electric conductivity; and a method using ultrafiltration, an ion exchange resin, or the like.

The abrasive grains dispersed by the above-described method may be further micronized. As the micronizing method, for example, a precipitating classification method (a method in which the abrasive grains are subjected to centrifugal separation by a centrifugal separator and then forcibly precipitated, and the only the supernatant liquid is removed) is exemplified. Other than, a high-pressure homogenizer in which the abrasive grains in the dispersing medium collide by high pressure may be used.

The content of cerium in the abrasive grains is preferably 50% by mass or more, more preferably 60% by mass or less, further preferably 70% by mass or less, particularly preferably 80% by mass or less, and extremely preferably 90% by mass or more, based on the total mass of the abrasive grains, from the viewpoint of easily obtaining an effect of improving the polishing rate of the insulating material. The content of cerium in the abrasive grains may be 100% by mass based on the total mass of the abrasive grains. The above-described content is the content of cerium in the entire abrasive grain, but the content of cerium in abrasive grain one particle may be in the above-described range.

The content of the abrasive grains containing cerium (for example, cerium oxide particles) is preferably 20% by mass or less, more preferably 10% by mass or less, further preferably 5% by mass or less, particularly preferably 3% by mass or less, and extremely preferably 1% by mass or less, based on the total mass of the polishing liquid, from the viewpoint of suppressing the agglomeration of the abrasive grains to obtain an effect of easily suppressing the occurrence of recessed defects, easily suppressing the occurrence of dishing, or the like. The content of the abrasive grains containing cerium (for example, cerium oxide particles) is preferably 0.01% by mass or more, more preferably 0.1% by mass or more, and further preferably 0.2% by mass or more, based on the total mass of the polishing liquid, from the viewpoint of easily obtaining an effect of improving the polishing rate of the insulating material. From these viewpoints, the content of the abrasive grains (for example, cerium oxide particles) is preferably 0.01 to 20% by mass, more preferably 0.1 to 10% by mass, further preferably 0.2 to 5% by mass, particularly preferably 0.2 to 3% by mass, and extremely preferably 0.2 to 1% by mass, based on the total mass of the polishing liquid.

The content of the abrasive grains is preferably 20% by mass or less, more preferably 10% by mass or less, further preferably 5% by mass or less, particularly preferably 3% by mass or less, and extremely preferably 1% by mass or less, based on the total mass of the polishing liquid, from the viewpoint of suppressing the agglomeration of the abrasive grains to easily suppress the occurrence of recessed defects. The content of the abrasive grains is preferably 0.01% by mass or more, more preferably 0.1% by mass or more, further preferably 0.2% by mass or more, based on the total mass of the polishing liquid, from the viewpoint of easily obtaining an effect of improving the polishing rate of the insulating material. From these viewpoints, the content of the abrasive grains is preferably 0.01 to 20% by mass, more preferably 0.1 to 10% by mass, further preferably 0.2 to 5% by mass, particularly preferably 0.2 to 3% by mass, and extremely preferably 0.2 to 1% by mass, based on the total mass of the polishing liquid.

Water-Soluble Compound A

The water-soluble compound A is a nonionic water-soluble compound. The water-soluble compound A contributes to suppression of polishing of the stopper, or the like. The reason for this is speculated that the nonionic water-soluble compound has a higher affinity for the stopper material (for example, polysilicon) than for the insulating material (for example, silicon oxide, carbon-containing silicon oxide, or the like) and easily adheres to the surface of the stopper than to the surface of the insulating portion. That is, it is speculated that, when the polishing of the insulating portion is advanced in the CMP step to expose the stopper, the water-soluble compound A adheres to the surface of the stopper to suppress the polishing of the stopper. Incidentally, in the present specification, the "water-soluble compound" is defined as a compound that is dissolved in an amount of 0.1 g or more with respect to 100 g of water at 25° C.

As the water-soluble compound A, a water-soluble compound that is widely used as a polishing retarder of the stopper material (for example, polysilicon) can be used. As the water-soluble compound A, a compound having a (poly)oxyalkylene chain (for example, polyalkylene glycol, a polyoxyalkylene derivative, and a (poly)oxyethylene adduct of acetylene-based diol); acetylene-based diol (for example, 2,4,7,9-tetramethyl-5-decyne-4,7-diol); polyglycerin; a vinyl alcohol polymer (provided that, a compound corresponding to the compound having a (poly)oxyalkylene chain is excluded); a water-soluble polymer compound having an N-mono-substituted product or N,N-di-substituted product skeleton of a compound selected from the group consisting of acrylamide, methacrylamide, and an α-substituted product thereof (for example, a polymer having at least one of an N-mono-substituted product and an N,N-di-substituted product as a monomer); and the like are preferably used. These can be used singly or in combination of two or more types thereof.

Examples of the polyalkylene glycol include polyethylene glycol and polypropylene glycol.

Examples of the polyoxyalkylene derivative include a compound in which a substituent is introduced into polyalkylene glycol, and a compound in which polyalkylene oxide is added to an organic compound. Examples of the substituent include alkyl ether, alkyl phenyl ether, phenyl ether, styrenated phenyl ether, alkylamine, fatty acid ester, glycol ester, polyglyceryl ether, diglyceryl ether, sugar ether, and sugar ester.

As the polyoxyalkylene derivative, for example, polyoxyethylene styrenated-phenyl ether (for example, NOIGEN (registered trademark) EA series manufactured by DKS Co. Ltd.); polyoxyalkylene alkyl ether (for example, Emulgen (registered trademark) series manufactured by Kao Corporation); polyoxyethylene alkyl phenyl ether (for example, Emulsit (registered trademark) series manufactured by DKS Co. Ltd.); polyoxyethylene sorbitan fatty acid ester (for example, SORGEN (registered trademark) TW series manufactured by DKS Co. Ltd.); polyoxyethylene fatty acid ester (for example, EMANON (registered trademark) series manufactured by Kao Corporation) such as polyethylene glycol monolaurate, polyethylene glycol monostearate, polyethylene glycol distearate, polyethylene glycol monooleate, or polyoxyethylene hydrogenated castor oil; polyoxyethylene alkylamine (for example, Amirazine (registered trademark) D manufactured by DKS Co. Ltd.); polyoxypropylene sorbitol (for example, UVIOL (registered trademark) HS-1600D manufactured by NOF CORPORATION); polyoxyalkylene diglyceryl ether such as polyoxyethylene diglyceryl ether (for example, SC-E series manufactured by Sakamoto Yakuhin Kogyo Co., Ltd.) or polyoxypropylene diglyceryl ether (for example, SY-DP series manufactured by Sakamoto Yakuhin Kogyo Co., Ltd.); polyoxyalkylene polyglyceryl ether such as polyoxyethylene polyglyceryl ether or polyoxypropylene polyglyceryl ether; a compound added with polyalkylene oxide (for example, Surfynol (registered trademark) 465 manufactured by Air Products Japan K.K.; or TMP series manufactured by NIPPON NYUKAZAI CO., LTD.); and the like are preferably used.

Examples of the (poly)oxyethylene adduct of acetylene-based diol include compounds such as 2,4,7,9-tetramethyl-5-decyne-4,7-diol-dipolyoxyethylene ether and 2,4,7,9-tetramethyl-5-decyne-4,7-diol-monopolyoxyethylene ether. From the viewpoint of both water solubility and surface tension reduction, particularly, 2,4,7,9-tetramethyl-5-decyne-4,7-diol-dipolyoxyethylene ether is preferred.

Since vinyl alcohol tends not to exist alone as a stable compound, the vinyl alcohol polymer is usually obtained by polymerization of a vinyl carboxylate monomer such as a vinyl acetate monomer to obtain polyvinyl carboxylate, followed by saponification (hydrolysis). Therefore, a vinyl alcohol polymer obtained using a vinyl acetate monomer as a raw material has, for example, an $OCOCH_3$ group and a hydrolyzed hydroxyl group (OH group) in the molecule, and the proportion of the hydroxyl group produced by hydrolysis is defined as a saponification degree. That is, a vinyl alcohol polymer whose saponification degree is not 100% has a structure which is substantially a copolymer of a vinyl carboxylate monomer and vinyl alcohol. Further, the vinyl alcohol polymer may be one in which a vinyl carboxylate monomer such as a vinyl acetate monomer and another vinyl group-containing monomer (for example, ethylene, propylene, styrene, vinyl chloride, or the like) are copolymerized, and all or some of the portions derived from the vinyl carboxylate monomer are saponified. Specific examples of such a vinyl alcohol polymer include PVA-403 manufactured by Kuraray Co., Ltd. and JC-25 manufactured by JAPAN VAM & POVAL CO., LTD. In the present specification, these are collectively defined as "vinyl alcohol polymer."

The vinyl alcohol polymer may be a derivative of a homopolymer of vinyl alcohol (that is, a polymer having a saponification degree of 100%), a derivative of a copolymer of a vinyl alcohol monomer and other vinyl group-containing monomer (for example, ethylene, propylene, styrene, vinyl chloride, vinyl acetate, or the like), or the like. Examples of such a derivative include compounds having at least a part of a hydroxyl group substituted with an amino group, a carboxyl group, an ester group, or the like, and compounds having at least a part of a hydroxyl group modified. Specific examples thereof include reactive polyvinyl alcohols (for example, GOHSEFIMER (registered trademark) Z manufactured by Nippon Synthetic Chemical Industry Co., Ltd.), cationized polyvinyl alcohols (for example, GOHSEFIMER (registered trademark) K manufactured by Nippon Synthetic Chemical Industry Co., Ltd.), anionized polyvinyl alcohols (for example, GOHSERAN (registered trademark) L and GOHSENOL (registered trademark) T manufactured by Nippon Synthetic Chemical Industry Co., Ltd.), and hydrophilic group-modified polyvinyl alcohols (for example, ECOMATI (registered trademark) manufactured by Nippon Synthetic Chemical Industry Co., Ltd.).

The water-soluble polymer compound having an N-mono-substituted product or N,N-di-substituted product skeleton is a water-soluble polymer compound having a structural unit derived from an N-mono-substituted product or an N,N-di-substituted product in a basic skeleton. Examples of the N-mono-substituted product or the N,N-di-substituted product include N-mono-substituted products such as N-methylacrylamide, N-ethylacrylamide, N-propylacrylamide, N-isopropylacrylamide, N-butylacrylamide, N-isobutylacrylamide, N-tert-butylacrylamide, N-heptylacrylamide, N-octylacrylamide, N-tert-octylacrylamide, N-dodecylacrylamide, N-octadecylacrylamide, N-methylolacrylamide, N-acetylacrylamide, N-diacetoneacrylamide, N-methyl methacrylamide, N-ethyl methacrylamide, N-propyl methacrylamide, N-isopropyl methacrylamide, N-butyl methacrylamide, N-isobutyl methacrylamide, N-tert-butyl methacrylamide, N-heptyl methacrylamide, N-octyl methacrylamide, N-tert-octyl methacrylamide, N-dodecyl methacrylamide, N-octadecyl methacrylamide, N-methylol methacrylamide, N-acetyl methacrylamide, and N-diacetone methacrylamide; and N,N-di-substituted products such as N,N-dimethylacrylamide, N,N-diethylacrylamide, N,N-dipropylacrylamide, N,N-diisopropylacrylamide, N,N-dibutylacrylamide, N,N-diisobutylacrylamide, N,N-tert-butylacrylamide, N,N-diheptylacrylamide, N,N-dioctylacrylamide, N,N-di-tert-octylacrylamide, N,N-didodecylacrylamide, N,N-dioctadecylacrylamide, N,N-dimethylolacrylamide, N,N-diacetylacrylamide, N,N-diacetoneacrylamide, N,N-dimethyl methacrylamide, N,N-diethyl methacrylamide, N,N-dipropyl methacrylamide, N,N-diisopropyl methacrylamide, N,N-dibutyl methacrylamide, N,N-diisobutyl methacrylamide, N,N-tert-butyl methacrylamide, N,N-diheptyl methacrylamide, N,N-dioctyl methacrylamide, N,N-di-tert-octyl methacrylamide, N,N-didodecyl methacrylamide, N,N-dioctadecyl methacrylamide, N,N-dimethylol methacrylamide, N,N-diacetyl methacrylamide, N,N-diacetone methacrylamide, acryloylpiperidine, acryloylmorpholine, acryloylthiomorpholine, and acryloylpyrrolidine.

As the water-soluble compound A, 2-hydroxyethyl methacrylate, alkyl alkanolamide, and the like may be used.

The weight average molecular weight of the water-soluble compound A is preferably 200 or more, more preferably 500 or more, further preferably 1,000 or more, and particularly preferably 2,000 or more. As the weight average molecular weight of the water-soluble compound A increases, the effect of suppressing the polishing of the stopper tends to increase. Further, the weight average molecular weight of the water-soluble compound A is preferably 3,000,000 or less, more preferably 1,000,000 or less, further preferably 50,000 or less, particularly preferably 20,000 or less, and extremely preferably 10,000 or less. When the weight average molecular weight of the water-soluble compound A is too large, the viscosity of the polishing agent increases and problems such as sedimentation of the abrasive grains may occur, but when the weight average molecular weight is in the above range, such problems hardly occur. From these viewpoints, the weight average molecular weight of the water-soluble compound A is preferably 200 to 3,000,000, more preferably 500 to 3,000,000, further preferably 1,000 to 1,000,000, particularly preferably 2,000 to 50,000, extremely preferably 2,000 to 20,000, and even more preferably 2,000 to 10,000.

The weight average molecular weight is measured by the following method and can be measured by reading a value obtained as "Mw."

Measuring Method

Equipment used (detector): "L-3300 type" differential refractometer for liquid chromatograph manufactured by Hitachi, Ltd.
Pump: "L-7100" for liquid chromatograph manufactured by Hitachi, Ltd.
Degassing apparatus: None
Data processing: GPC integrator "D-2520" manufactured by Hitachi, Ltd.
Column: "Shodex Asahipak GF-710HQ," manufactured by Showa Denko K.K., inner diameter 7.6 mm×300 mm
Eluent: 50 mM-$Na_2HPO_4$ aqueous solution/acetonitrile=90/10 (v/v)
Measurement temperature: 25° C.
Flow rate: 0.6 mL/min (L represents liter, same as below)
Measurement time: 30 min
Sample: sample prepared by adjusting a concentration with a solution having the same composition as the eluent so that the resin concentration becomes 2% by mass and filtering through a 0.45 μm polytetrafluoroethylene filter
Injection amount: 0.4 μL
Standard substance: narrow-molecular-weight sodium polyacrylate manufactured by Polymer Laboratories The content of the water-soluble compound A is preferably 0.005% by mass or more, more preferably 0.01% by mass or more, and further preferably 0.05% by mass or more, based on the total mass of the polishing liquid. When the content of the water-soluble compound A is 0.005% by mass or more, the polishing suppressing effect with respect to the stopper material (particularly, polysilicon) is easily obtainable. Further, the content of the water-soluble compound A is preferably 2% by mass or less, more preferably 1% by mass or less, and further preferably 0.3% by mass or less, based on the total mass of the polishing liquid. When the content of the water-soluble compound A is 2% by mass or less, the polishing rate of the insulating material (particularly, silicon oxide) is easy to become sufficient, and a decrease in flowability caused by gelation of the polishing liquid hardly occurs.

From these viewpoints, the content of the water-soluble compound A is preferably 0.005 to 2% by mass, more preferably 0.005 to 1% by mass, further preferably 0.005 to 0.3% by mass, particularly preferably 0.01 to 0.3% by mass, and extremely preferably 0.05 to 0.3% by mass, based on the total mass of the polishing liquid.

Polymer Compound B

The polymer compound B is a polymer compound having at least one selected from the group consisting of carboxylic acid groups and carboxylate groups. The polymer compound B contributes to, for example, reducing the dishing amount in the insulating portion. The polymer compound B may be used singly or in combination of two or more kinds thereof. Incidentally, the polymer compound B can also be used for dispersing the abrasive grains.

The number of carboxylic acid groups and carboxylate groups in the polymer compound B is not particularly limited. The polymer compound B may be monocarboxylic acid or a salt thereof or may be polycarboxylic acid or a salt thereof. The polymer compound B may be, for example, a special polycarboxylate type polymer compound (DEMOL (registered trademark) EP manufactured by Kao Corporation, or the like).

As the polymer compound B, a polymer or a salt thereof obtained by polymerizing a monomer containing at least one selected from the group consisting of acrylic acids and methacrylic acids (hereinafter, these are collectively referred to as "(meth)acrylic acid-based polymer") is preferably used. The monomer may include other monomers copolymerizable with acrylic acid or methacrylic acid (excluding acrylic acid and methacrylic acid).

The polymer compound B may be at least one selected from the group consisting of a homopolymer of acrylic acid (polyacrylic acid), a homopolymer of methacrylic acid (polymethacrylic acid), a copolymer of acrylic acid and methacrylic acid, a copolymer of acrylic acid or methacrylic acid and other monomer, a copolymer of acrylic acid, methacrylic acid, and other monomer, and salts thereof Among them, as the (meth)acrylic acid-based polymer, from the viewpoint of obtaining favorable adsorption to a material to be polished (an insulating material or the like), at least one selected from the group consisting of a homopolymer of acrylic acid (polyacrylic acid) and a salt thereof is preferred. As the salt of the polymer (a polymer having a carboxylate group), an ammonium salt and the like are exemplified. As the ammonium salt, ammonium polyacrylate and the like are exemplified. Incidentally, the (meth)acrylic acid-based polymer may be used singly or in combination of two or more kinds thereof.

Examples of the other monomers (other monomers copolymerizable with acrylic acid or methacrylic acid) include an unsaturated carboxylic acid such as crotonic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, or heptadecenoic acid; and a vinyl compound such as ethylene, propylene, or styrene.

The weight average molecular weight of the polymer compound B is not particularly limited, and is preferably 500 to 150,000 and more preferably 1,000 to 80,000. When the weight average molecular weight of the polymer compound B is 500 or more, a favorable polishing rate is easily obtainable when the insulating material (silicon oxide or the like) is polished. When the weight average molecular weight of the polymer compound B is 150,000 or less, the storage stability of the polishing liquid hardly decreases. The weight average molecular weight of the polymer compound B can be measured by the same method as in the water-soluble compound A.

The content of the polymer compound B in the polishing liquid is preferably 0.001% by mass or more, more preferably 0.01% by mass or more, further preferably 0.05% by mass or more, and particularly preferably 0.1% by mass or more, based on the total mass of the polishing liquid. The content of the polymer compound B is preferably 2% by mass or less, more preferably 1% by mass or less, further preferably 0.5% by mass or less, particularly preferably 0.35% by mass or less, and extremely preferably 0.25% by mass or less, based on the total mass of the polishing liquid. The content of the polymer compound B may be 0.30% by mass or less or 0.20% by mass or less. When the content of the polymer compound B is 0.001 to 2.0% by mass, there is a tendency that the storage stability can be favorable, the dishing amount, the wiring density dependence, or the like is reduced, and the surface flatness can be improved. That is, when the content of the polymer compound B is 0.001% by mass or more, there is a tendency that the dishing amount can be reduced and the surface flatness can be sufficiently secured, and when the content of the polymer compound B is 2% by mass or less, there is a tendency that the storage stability of the abrasive grains is improved so that agglomeration of the abrasive grains or the like hardly occurs, and effects of easily suppressing the occurrence of recessed defects, easily reducing the dishing amount, and the like are obtainable. From these viewpoints, the content of the polymer compound B is preferably 0.001 to 2% by mass, more preferably 0.01 to 1% by mass, further preferably 0.05 to 0.5% by mass, particularly preferably 0.05 to 0.35% by mass, extremely preferably 0.05 to 0.25% by mass, and even more preferably 0.1 to 0.25% by mass.

pH Adjusting Agent

The polishing liquid of the present embodiment can contain a pH adjusting agent (for example, a basic pH adjusting agent) as necessary. Thereby, the desired pH can be adjusted. The pH adjusting agent is not particularly limited, and examples thereof include inorganic acid components such as nitric acid, sulfuric acid, hydrochloric acid, phosphoric acid, and boric acid; and basic components (basic pH adjusting agents) such as sodium hydroxide, ammonia, potassium hydroxide, and calcium hydroxide. The pH can be adjusted using an organic acid component. In the case of using the polishing liquid in polishing of semiconductors, ammonia or an acid component is suitably used.

The content of the basic pH adjusting agent in the polishing liquid is less than $1.3 \times 10^{-2}$ mol mol/kg based on the total mass of the polishing liquid, from the viewpoint of suppressing the occurrence of recessed defects in the stopper (polishing stop layer formed from a stopper material such as polysilicon). From the same viewpoint, the content of the basic pH adjusting agent is preferably $1.4 \times 10^{-2}$ mol/kg or less, more preferably less than $5.0 \times 10^{-3}$ mol/kg, and further preferably less than $4.0 \times 10^{-3}$ mol/kg, based on the total mass of the polishing liquid. The lower limit value of the content of the basic pH adjusting agent is not particularly limited, but may be $1.0 \times 10^{-4}$ mol/kg, $1.2 \times 10^{-4}$ mol/kg, or $1.8 \times 10^{-4}$ mol/kg, based on the total mass of the polishing liquid, from the viewpoint of adjusting the pH to a pH at which favorable storage stability of the abrasive grains are obtainable.

pH

The pH of the polishing liquid is preferably 4.0 or more, more preferably 4.5 or more, further preferably 4.7 or more, and particularly preferably 5.0 or more. The pH of the polishing liquid is preferably 6.0 or less, more preferably 5.8 or less, further preferably 5.7 or less, and particularly preferably 5.6 or less. When the pH is 4.0 to 6.0, excellent storage stability can be obtained while having an excellent polishing rate of the insulating material. Further, there is a tendency that the dishing amount can be reduced while suppressing the occurrence of recessed defects in the stopper, and the surface flatness can be improved. That is, when the pH of the polishing liquid is 4.0 or more, there is a tendency that the storage stability of the abrasive grains is improved so that agglomeration of the abrasive grains or the like hardly occurs, and effects of easily suppressing the occurrence of recessed defects, easily reducing the dishing amount, and the like are obtainable. Further, when the pH of the polishing liquid is 6.0 or less, there is a tendency that the dishing amount can be reduced while suppressing the occurrence of recessed defects, and the surface flatness can be sufficiently secured. From these viewpoints, the pH of the polishing liquid is preferably 4.0 to 6.0, more preferably 4.5 to 6.0, further preferably 4.7 to 6.0, particularly preferably 5.0 to 6.0, extremely preferably 5.0 to 5.8, even more preferably 5.0 to 5.7, and very preferably 5.0 to 5.6. The pH of the polishing liquid may be 4.5 to 5.8 or 4.7 to 5.6.

The pH of the polishing liquid can be measured using a pH meter (for example, Model PH81 (trade name) manufactured by Yokogawa Electronic Corp.). Specifically, for example, after two points calibration is performed using a phthalate pH buffer solution (pH: 4.01) and a neutral phosphate pH buffer solution (pH: 6.86) as standard buffer solutions, an electrode of the pH meter is put into the polishing liquid, and the pH stabilized after 2 minutes or longer at 25° C. is then measured. At this time, both the liquid temperatures of the standard buffer solutions and the polishing liquid are set to 25° C.

Water

Water is not particularly limited, but deionized water, ion-exchanged water, ultrapure water, and the like are preferred. The content of water may be the balance of the content of the above-described respective components contained and is not particularly limited as long as water is contained in the polishing liquid. Incidentally, the polishing liquid may further contain a solvent other than water (for example, a polar solvent such as ethanol or acetone) as necessary.

Dispersant

The polishing liquid of the present embodiment can contain a dispersant (excluding the water-soluble compound A and the polymer compound B) as necessary. The content of the dispersant is preferably 0.001 to 4% by mass based on the total mass of the abrasive grains. Examples of the dispersant include a water-soluble cationic compound, a water-soluble anionic compound, and a water-soluble amphoteric compound, and of them, from the viewpoint of having large electrostatic repulsion and favorable dispersibility, a water-soluble anionic compound is preferred.

Examples of the water-soluble cationic compound include polyvinylpyrrolidone and a copolymer containing polyvinylpyrrolidone (hereinafter, both are collectively referred to as polyvinylpyrrolidones), coconut amine acetate, and stearyl amine acetate.

The content of the polyvinylpyrrolidones is preferably 0.005 to 5% by mass based on the total mass of the polishing liquid. The weight average molecular weight of the polyvinylpyrrolidones is preferably 10,000 to 1,200,000. When the weight average molecular weight of the polyvinylpyrrolidones is 10,000 or more, surface flatness is easy to improve, and when the weight average molecular weight of the polyvinylpyrrolidones is 1,200,000 or less, the agglomeration of the abrasive grains tends to be easily suppressed. The pH of the polishing liquid in the case of using the polyvinylpyrrolidones is preferably 5.0 or more and 12.0 or less, and more preferably 6.0 or more and 7.0 or less. When the pH is 5.0 or more, the polishing rate of the stopper (for example, the polysilicon film) is difficult to increase, and when the pH is 12 or less, the polishing rate of the insulating portion (for example, the silicon oxide film) is easy to improve.

Examples of the water-soluble anionic compound include triethanolamine laurylsulfate, ammonium laurylsulfate, and triethanolamine polyoxyethylene alkylether sulfate.

Examples of the water-soluble amphoteric compound include lauryl betaine, stearyl betaine, lauryldimethylamine oxide, and 2-alkyl-N-carboxymethyl-N-hydroxyethyl imidazolinium betaine.

Organic Acid Component

The polishing liquid of the present embodiment may contain at least one organic acid component selected from the group consisting of organic acids and organic acid salts. The organic acid component contributes to reducing of the dishing amount and obtaining of further favorable surface flatness. The organic acid component is considered to suppress the dissociation of a carboxyl group in the polymer compound B. According to this, it is considered that the hydrophobicity of the polymer compound B is increased and the polymer compound B is further easily adsorbed to a material to be polished (an insulating material or the like). Incidentally, the organic acid component is a low molecular compound having a molecular weight of less than 500.

As the organic acid component, a compound (water-soluble organic compound or the like) having at least one selected from the group consisting of —COOM group, phenolic-OM group, —$SO_3M$ group, —$O.SO_3M$ group, —$PO_4M_2$ group and —$PO_3M_2$ group (M represents a cation) is preferred.

Examples of M in the formula include H; $NH_4$; alkali metals such as Na and K; alkaline-earth metals such as Ca and Mg; metals capable of obtaining trivalent such as Al, Fe, and Cr; and rare-earth metals such as Ce.

It is considered that the organic acid component interacts with the polymer compound B and forms a strong film on the surface of the insulating portion. More specifically, it is considered that, for example, the carboxyl group (anionic) of the polymer compound B electrostatically attracts a cation (M or the like described above) in the organic acid component, the polymer compound B is in "a rolled state" using the cation as a nucleus, and this polymer compound B is adsorbed on the surface of the insulating portion to form a protective film. This protective film is stronger than a protective film formed by the polymer compound B which is not in a "rolled state" and is considered to contribute to the effect of improving high surface flatness (the effect of reducing the dishing amount). Further, the organic acid part in the organic acid component is considered to suppress the dissociation of a carboxyl group in the polymer compound B. According to this, it is considered that the hydrophobicity of the polymer compound B is increased and the polymer compound B is further easily adsorbed to the polished surface of the insulating portion.

Preferred specific examples of the organic acid component include carboxylic acids such as formic acid, acetic acid, propionic acid, butyric acid, valeric acid, cyclohexane carboxylic acid, phenylacetic acid, benzoic acid, o-toluic acid, m-toluic acid, p-toluic acid, o-methoxybenzoic acid, m-methoxybenzoic acid, p-methoxybenzoic acid, acrylic acid, methacrylic acid, crotonic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, isobutyric acid, isovaleric acid, cinnamic acid, quinaldic acid, nicotinic acid, 1-naphthoic acid, 2-naphthoic acid, picolinic acid, vinylacetic acid, phenylacetic acid, phenoxyacetic acid, 2-furancarboxylic acid, mercaptoacetic acid, levulinic acid, oxalic acid, malonic acid, succinic acid, glutaric acid, adipic acid, pimelic acid, suberic acid, azelaic acid, sebacic acid, 1,9-nonanedicarboxylic acid, 1,10-decanedicarboxylic acid, 1,11-undecanedicarboxylic acid, 1,12-dodecane dicarboxylic acid, 1,13-tridecane dicarboxylic acid, 1,14-tetradecane dicarboxylic acid, 1,15-pentadecane dicarboxylic acid, 1,16-hexadecane dicarboxylic acid, maleic acid, fumaric acid, itaconic acid, citraconic acid, mesaconic acid, quinolinic acid, quinic acid, naphthalic acid, phthalic acid, isophthalic acid, terephthalic acid, glycolic acid, lactic acid, 3-hydroxypropionic acid, 2-hydroxybutyric acid, 3-hydroxybutyric acid, 4-hydroxybutyric acid, 3-hydroxyvaleric acid, 5-hydroxyvaleric acid, quinic acid, kynurenic acid, salicylic acid, tartaric acid, aconitinic acid, ascorbic acid, acetylsalicylic acid, acetylmalic acid, acetylene dicarboxylic acid, acetoxy succinic acid, acetoacetic acid, 3-oxoglutaric acid, atropic acid, atrolactic acid, anthraquinone carboxylic acid, anthracene carboxylic acid, caproic acid, isocaproic acid, isocamphoronic acid, isocrotonic acid, 2-ethyl-2-hydroxybutyric acid, ethylmalonic acid, ethoxy acetic acid, oxaloacetic acid, oxydiacetic acid, 2-oxobutyric acid, camphoronic acid, citric acid, glyoxylic acid, glycidic acid, glyceric acid, glucaric acid, gluconic acid, croconic acid, cyclobutane carboxylic acid, cyclohexane dicarboxylic acid, diphenylacetic acid, di-o-benzoyl tartaric acid, dimethyl succinic acid, dimethoxyphthalic acid, tartronic acid, tannic acid, thiophene carboxylic acid, tiglic acid, desoxalic acid, tetrahydroxysuccinic acid, tetramethylsuccinic acid, tetronic acid, dehydroacetic acid, terebic acid, tropic acid, vanillic acid, paraconic acid, hydroxyisophthalic acid, hydroxycinnamic acid, hydroxynaphthoic acid, o-hydroxyphenylacetic acid, m-hydroxyphenylacetic acid, p-hydroxyphenylacetic acid, 3-hydroxy-3-phenylpropionic acid, pivalic acid, pyridine dicarboxylic acid, pyridine tricarboxylic acid, pyruvic acid, a-phenylcinnamic acid, phenylglycidic acid, phenylsuccinic acid, phenylacetic acid, phenyl lactic acid, propiolic acid, sorbic acid, 2,4-hexadienedioic acid, 2-benzylidyne propionic acid, 3-benzylidyne propionic acid, benzylidyne malonic acid, benzilic acid, benzene tricarboxylic acid, 1,2-benzene diacetic acid, benzoyloxyacetic acid, benzoyloxypropionic acid, benzoylformic acid, benzoylacetic acid, o-benzoyl lactic acid, 3-benzoyl propionic acid, gallic acid, mesoxalic acid, 5-methyl isophthalic acid, 2-methyl crotonic acid, a-methyl cinnamic acid, methyl succinic acid, methyl malonic acid, 2-methyl butyric acid, o-methoxycinnamic acid, p-methoxycinnamic acid, mercaptosuccinic acid, mercaptoacetic acid, o-lactoyllactic acid, malic acid, leuconic acid, leucine acid, rhodizonic acid, rosolic acid, a-ketoglutaric acid, L-ascorbic acid, iduronic acid, galacturonic acid, glucuronic acid, pyroglutamic acid, ethylenediaminetetraacetic acid, cyano-triacetic acid, aspartic acid, glutamic acid, N'-hydroxyethyl-N,N,N'-triacetic acid, and nitrilotriacetic acid; phenols such as o-aminophenol, m-aminophenol, and p-aminophenol; sulfonic acids such as methanesulfonic acid, ethanesulfonic acid, propanesulfonic acid, butanesulfonic acid, pentanesulfonic acid, hexanesulfonic acid, heptanesulfonic acid, octanesulfonic acid, nonanesulfonic acid, decane sulfonic acid, undecane sulfonic acid, dodecane sulfonic acid, tridecane sulfonic acid, tetradecane sulfonic acid, pentadecane sulfonic acid, hexadecane sulfonic acid, heptadecane sulfonic acid, octadecane sulfonic acid, benzenesulfonic acid, naphthalenesulfonic acid, toluenesulfonic acid (for example, p-toluenesulfonic acid), hydroxyethane sulfonic acid, hydroxyphenol sulfonic acid, and anthracene sulfonic acid; and phosphonic acids such as decyl phosphonic acid and phenyl phosphonic acid. The carboxylic acid is expected to have the effect of improving the dispersibility of the abrasive grains, or the like.

Further, the organic acid component may be derivatives obtained by substituting one or two or more protons of main chains of the above-described carboxylic acid, sulfonic acid, and phosphonic acid with an atom or atomic group such as F, Cl, Br, I, OH, CN, or $NO_2$.

The pKa of the organic acid component is preferably less than 9, more preferably less than 8, further preferably less than 7, particularly preferably less than 6, and extremely preferably less than 5. When the pKa of the organic acid component is less than 9, at least a portion of the organic acid component in the polishing liquid is changed to organic acid ions to release hydrogen ions, thereby easily maintaining pH in a desired pH range. Further, the effect of suppressing the dissociation of the carboxyl group in the polymer compound B is further increased, which is effective for improving the surface flatness.

The organic acid component may be used singly or in combination of two or more kinds thereof.

The content of the organic acid component is preferably 0.001% by mass, more preferably 0.005% by mass or more, and further preferably 0.01% by mass or more, based on the total mass of the polishing liquid, from the viewpoint of easily improving the surface flatness of the insulating portion (for example, an insulating portion containing silicon oxide) after the completion of polishing. The content of the organic acid component is preferably 2% by mass or less, more preferably 1% by mass or less, and further preferably 0.5% by mass or less, from the viewpoint of sufficiently improving the polishing rate of the insulating material. From these viewpoints, the content of the organic acid component is preferably 0.001 to 2% by mass, more preferably 0.005 to 1% by mass, and further preferably 0.01 to 0.5% by mass, based on the total mass of the polishing liquid.

Other Additives

The polishing liquid of the present embodiment can contain components other than the abrasive grains, the water-soluble compound A, the polymer compound B, the pH adjusting agent, water, the dispersant, and the organic acid component, as other additives. Examples of the other additives include water-soluble polymer compounds (excluding the water-soluble compound A and the polymer compound B). Examples of the water-soluble polymer compounds include polysaccharides such as alginic acid, pectinic acid, carboxymethyl cellulose, agar, curdlan, pullulan, dextrin, and cyclic dextrin.

In the case of storing the polishing liquid while being divided into a cerium slurry and an additive liquid, the other additives are preferably contained in the additive liquid. These additives may be used singly or in combination of two or more kinds thereof.

The constituent components of the polishing liquid of the present embodiment may be stored while being divided into two or more liquids so as to be the polishing liquid. For example, the constituent components of the polishing liquid may be stored as a two-pack type polishing liquid set (for example, a CMP polishing liquid set) containing the abrasive grains containing cerium and the cerium slurry containing water (first liquid) and an additive liquid (second liquid) containing the water-soluble compound A, the polymer compound B, and water, and both liquids may be mixed to obtain a polishing liquid. In this case, components (for example, a pH adjusting agent) other than the abrasive grains may be contained in the second liquid. The pH adjusting agent may be contained in the first liquid as long as the polarity of the potential of the abrasive grains contained in the first liquid is not changed. The organic acid component and the respective components described in "Other additives" are preferably contained in the second liquid. Incidentally, the constituent components of the polishing liquid may be stored as a polishing liquid set divided into three or more liquids.

In the polishing liquid set, the slurry and the additive liquid are mixed immediately before the polishing or during the polishing to prepare the polishing liquid. Further, a one-pack type polishing liquid may be stored as a stock solution for a polishing liquid with a reduced water content and used by dilution with water immediately before the polishing or during the polishing. The two-pack type polishing liquid set may be stored as a stock solution for a slurry and a stock solution for an additive liquid with a reduced water content, and used by dilution with water immediately before the polishing or during the polishing.

In the case of the one-pack type polishing liquid, as a method of supplying the polishing liquid onto a polishing platen, a method of directly sending the polishing liquid for supplying; a method of sending the stock solution for a polishing liquid and water through separate pipes and converging these to mix for supplying; a method of mixing the stock solution for a polishing liquid and water in advance for supplying; or the like can be used.

In the case of storing the constituent components of the polishing liquid as a two-pack type polishing liquid set divided into a slurry and an additive liquid, the polishing rate can be adjusted by arbitrarily changing the blending of these two liquids. In the case of polishing using the polishing liquid set, examples of the method of supplying the polishing liquid onto a polishing platen include methods described below. For example, a method of sending the slurry and the additive liquid through separate pipes, and converging these pipes to mix for supplying; a method of sending the stock solution for a slurry, the stock solution for an additive liquid, and water through separate pipes, and converging these to mix for supplying; a method of mixing the slurry and the additive liquid in advance for supplying; or a method of mixing the stock solution for a slurry, the stock solution for an additive liquid, and water in advance for supplying can be used. Further, a method of supplying each of the slurry and the additive liquid in the polishing liquid set onto a polishing platen can also be used. In this case, the surface to be polished is polished using a polishing liquid obtained by mixing the slurry and the additive liquid on the polishing platen.

The polishing liquid and the polishing liquid set of the present embodiment are suitably used for removing a part of an insulating portion of a base substrate, which includes a substrate, a stopper provided on one surface of the substrate, and the insulating portion provided on a surface of the stopper opposite to the substrate, by CMP to expose the stopper, but can also be used in other use applications. For example, the polishing liquid and the polishing liquid set of the present embodiment can also be used for removing a part of an insulating portion of a base substrate, which has the insulating portion but does not have a stopper, by CMP.

Method for Producing Polishing Liquid

The method for producing the polishing liquid of the present embodiment includes, for example, a polishing liquid producing step of obtaining a polishing liquid by mixing at least the abrasive grains, the water-soluble compound A, the polymer compound B, and water. In the polishing liquid producing step, components which are arbitrarily added (for example, a pH adjusting agent, a dispersant, and the like) may be further mixed. In the polishing liquid producing step, the respective components may be mixed simultaneously or sequentially. For example, after mixing the abrasive grains containing cerium (for example, abrasive grains containing cerium oxide) and water to obtain a cerium slurry (for example, a cerium oxide slurry), the cerium slurry, the water-soluble compound A, the polymer compound B, and water may be mixed. Further, after obtaining a mixed liquid containing the abrasive grains, the water-soluble compound A, the polymer compound B, and water, a pH adjusting agent may be added to the mixed liquid.

The method for producing the polishing liquid of the present embodiment may include a step of obtaining abrasive grains containing cerium (for example, abrasive grains containing cerium oxide), a step of obtaining a water-soluble compound A, or a step of obtaining a polymer compound B, before the polishing liquid producing step.

The method for producing the polishing liquid of the present embodiment preferably includes a dispersing step of dispersing abrasive grains in water. The dispersing step is, for example, a step of mixing abrasive grains and a dispersant. In this case, preferably, the dispersant is added in a step of obtaining a cerium slurry (for example, cerium oxide slurry). That is, the cerium slurry preferably contains a dispersant. In the dispersing step, for example, abrasive grains, a dispersant, and a water are mixed, and the abrasive grains are dispersed in water to obtain a cerium oxide slurry.

Polishing Method

The polishing method of the present embodiment is a polishing method of polishing a base substrate, which includes a substrate, a stopper provided on one surface of the substrate, and an insulating portion provided on a surface of the stopper opposite to the substrate, using the polishing liquid of the present embodiment (base substrate polishing method). The polishing method of the present embodiment includes a polishing step of removing a part of the insulating portion of the base substrate by CMP using the polishing liquid of the present embodiment to expose the stopper, and may further include a base substrate preparing step of preparing a base substrate, a washing step of washing the base substrate after the completion of polishing, and the like. In the polishing method of the present embodiment, as the polishing liquid, the aforementioned one-pack type polishing liquid may be used, or a polishing liquid obtained by mixing a slurry (first liquid) and an additive liquid (second liquid) in the polishing liquid set may be used.

The polishing method of the present embodiment can be suitably used, for example, in the flattening step of an interlayer insulating film, a BPSG film, or the like, the formation step of shallow trench isolation (STI), and the like. Examples of the base substrate polished by the polishing method according to the present embodiment include substrates including a discrete semiconductor such as diode, transistor, compound semiconductor, thermistor, varistor, or thyristor; a memory element such as dynamic random access memory (DRAM), static random access memory (SRAM), erasable programmable read-only memory (EPROM), mask read-only memory (mask ROM), electrically erasable programmable read-only memory (EEPROM), or flash memory; a logic circuit element such as a microprocessor, DSP, or ASIC; an integrated circuit element such as a compound semiconductor typified by a monolithic microwave integrated circuit (MMIC); a hybrid integrated circuit (hybrid IC) or a photoelectric conversion element such as light emitting diode or charge-coupled element; and the like.

Hereinafter, an example of the polishing method of the present embodiment will be described with reference to FIG. 1.

FIG. 1 is a schematic cross-sectional view illustrating an example of a polishing method of the present embodiment. In this polishing method, first, as a base substrate, a base substrate 100, which includes a substrate (for example, a wafer) 1 in which a concavo-convex pattern formed of concave portions (trench portions) and convex portions (active portions) is formed on the surface, a stopper 2 provided on the convex portion of the substrate 1, and an insulating portion 3 provided on the substrate 1 and the stopper 2 so as to fill the concave portions of the concavo-convex pattern of the substrate 1, is prepared (base substrate preparing step) (see FIG. 1(A)).

Examples of the substrate 1 include substrates for semiconductor element production (for example, substrates having an insulating portion (for example, an insulating film formed from an inorganic insulating material) formed on a semiconductor substrate such as a semiconductor substrate having a circuit element and a wiring pattern formed thereon or a semiconductor substrate having a circuit element formed thereon). Incidentally, the concavo-convex pattern is formed on the substrate of the substrate illustrated in FIG. 1, but the polishing method of the present embodiment can also be applied to a substrate in which the concavo-convex pattern is not formed on the surface.

Examples of the stopper material constituting the stopper 2 include single-crystal silicon, polysilicon, and amorphous silicon. The shape of the stopper 2 is not particularly limited, and for example, a film shape (a stopper film: for example, a polysilicon film) In the polishing method of the present embodiment, when the stopper material is polysilicon, the effect of suppressing recessed defects in the stopper becomes remarkable.

Examples of the insulating material constituting the insulating portion 3 include an inorganic insulating material and an organic insulating material. Examples of the inorganic insulating material include silicon-based insulating materials. Examples of the silicon-based insulating material include silica-based materials such as silicon oxide, carbon-containing silicon oxide, fluorosilicate glass, organosilicate glass, and hydrogenated silsesquioxane; silicon carbide; and silicon nitride. Examples of the organic insulating material include wholly aromatic based low dielectric constant insulating materials. The insulating material (silicon oxide or the like) may be doped with an element such as phosphorus or boron. The shape of the insulating portion 3 is not particularly limited, and for example, is a film shape (an insulating film).

The combination of the stopper material and the insulating material is not particularly limited, but from the viewpoint that the effect of the present invention becomes remarkable, preferably, the stopper material is polysilicon and the insulating material is silicon oxide. In other words, the polishing step is preferably a step of polishing silicon oxide by using polysilicon as the stopper material.

In the substrate preparing step, the base substrate 100 may be obtained by forming the insulating portion 3 on one surface of the substrate 1 provided with the stopper 2 on one surface. For example, the base substrate 100 may be obtained by preparing a substrate having the substrate 1 and the stopper 2 formed on the convex portion of the substrate 1, and then depositing an insulating material constituting the insulating portion 3 on the substrate 1 and the stopper 2 so as to fill a concave portion on the surface of the substrate 1. Examples of the method for forming the insulating portion 3 include a low-pressure CVD method, a plasma CVD method, and a coating method.

In a case where the insulating portion 3 is a silicon oxide film formed of silicon oxide, the formation of the silicon oxide film by the low-pressure CVD method can be performed using monosilane ($SiH_4$) as the Si source and oxygen ($O_2$) as the oxygen source. This $SiH_4$—$O_2$-based oxidation reaction is carried out at a low temperature of 400° C. or lower, thereby obtaining the silicon oxide film. In some cases, the silicon oxide film obtained by CVD is subjected to a heat treatment at 1,000° C. or lower. A $SiH_4$—$O_2$—$PH_3$-type reaction gas is preferably used in a case where the silicon oxide film is doped with phosphorus (P) for achieving surface smoothness by high-temperature reflow.

The plasma CVD has an advantage that chemical reaction, which requires high temperature under normal thermal equilibrium, can be carried out at a low temperature. A method of generating plasma may include two methods, that is, a capacitively coupled method and an inductively coupled method. Examples of the reaction gas include a $SiH_4$—$N_2O$-type gas using $SiH_4$ as the Si source and $N_2O$ as the oxygen source and a TEOS-O-type gas (TEOS-plasma CVD method) using tetraethoxysilane (TEOS) as the Si source. The substrate temperature is preferably 250 to 400° C. and the reaction pressure is preferably 67 to 400 Pa.

In a case where the insulating portion 3 is a silicon nitride film formed of silicon nitride, the formation of the silicon nitride film by the low-pressure CVD method can be performed using dichlorosilane ($SiH_2Cl_2$) as the Si source and ammonia ($NH_3$) as the nitrogen source. This $SiH_2Cl_2$—$NH_3$-based oxidation reaction is carried out at a high temperature of 900° C. or the like, thereby obtaining the silicon nitride film. As the reaction gas in the formation of the silicon nitride film by the plasma CVD method, a $SiH_4$—$NH_3$-based gas using $SiH_4$ as the Si source and $NH_3$ as the nitrogen source, and the like are exemplified. The substrate temperature is preferably 300 to 400° C.

In the substrate preparing step, the stopper 2 (for example, a polysilicon film) may be formed on the substrate 1 by a CVD method. The formation of the polysilicon film by the CVD method is carried out, for example, using $SiH_4$ as the Si source and at a substrate temperature of 600 to 1,000° C.

Next, the surface of the base substrate 100 (the surface of the insulating portion 3, the surface formed by the insulating material) is polished using the polishing liquid of the present embodiment by CMP (polishing step) (see FIG. 1(B)). Thereby, a part of the insulating portion 3 is removed to expose the stopper 2.

The polishing step can be performed, for example, using a general polishing apparatus having a holder capable of holding the base substrate and a polishing platen on which a polishing pad can be mounted, and the polishing pad. The polishing step is performed, for example, in the following procedure. First, the base substrate 100 is arranged on the polishing pad such that the surface of the base substrate 100 (the surface of the insulating portion 3 and the surface formed of an insulating material) faces the polishing pad (polishing cloth) (base substrate arrangement step). Next, in a state where the surface of the base substrate 100 is pressed against the polishing pad of the polishing platen, the polishing liquid is supplied between the polishing pad and the insulating portion 3, and the base substrate 100 and the polishing platen are relatively moved to polish the surface of the base substrate 100. The insulating portion 3 is removed by polishing until the stopper 2 is exposed, thereby obtaining a base substrate 200 illustrated in FIG. 1(B).

In the polishing step, it is preferable to finish the polishing at the time point at which a surface, which is parallel to the substrate 1, of the surfaces of the stopper 2 s entirely exposed. In the polishing step, a part of the stopper 2 may be polished along with the insulating portion 3, but it is preferable that the stopper 2 is not polished from the viewpoint of preventing recessed defects from occurring in the stopper 2.

Specific examples of the polishing apparatus include a polishing apparatus (trade name: Mirra-3400, Reflexion LK) manufactured by Applied Materials, Inc. and a polishing apparatus (trade name: F-REX300) manufactured by EBARA CORPORATION.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, from the viewpoint of obtaining a further excellent polishing rate and further excellent surface flatness, foamed polyurethane and unfoamed polyurethane are preferred. The polishing pad may be subjected to groove processing by which the polishing liquid accumulates thereon.

Polishing conditions are not particularly limited. The rotational speed of the polishing platen is preferably 200 min$^{-1}$ (rpm) or less to prevent the base substrate 100 from flying off from the polishing platen. The polishing pressure (machining load) applied to the base substrate 100 is preferably 100 kPa or less from the viewpoint of sufficiently suppressing occurrence of polishing scratches on the surface after polishing (for example, the occurrence of recessed defects in the stopper). In the polishing step, it is preferable that the polishing liquid is continuously suppled to the polishing pad with a pump or the like during polishing. The supply amount is not limited, but it is preferable that the surface of the polishing pad is covered with the polishing liquid at all times.

Finally, the base substrate after the completion of polishing is thoroughly washed in flowing water to remove the particles adhering to the base substrate (washing step). For the washing, in addition to pure water, dilute hydrofluoric acid or aqueous ammonia may be used or a brush may be used in order to increase the washing efficiency. Further, after washing, it is preferable that water droplets adhering to the base substrate are dropped by using a spin dryer or the like, and then the base substrate is dried. Incidentally, the polishing method of the present embodiment preferably includes the washing step, but may not include the washing step.

According to the polishing method of the embodiment, a high polishing rate ratio R (the polishing rate of the insulating material/the polishing rate of the stopper material) is obtainable, and the insulating material (the insulating portion) can be selectively (preferentially) polished with respect to the stopper material (the stopper). In the polishing method of the present embodiment, particularly, there is a tendency that silicon oxide can be selectively (preferentially) polished with respect to polysilicon. In other words, in the polishing method of the present embodiment, the polishing step is a step of selectively (preferentially) polishing the insulating material (the insulating portion) with respect to the stopper material (the stopper), and may be a step of selectively (preferentially) polishing silicon oxide with respect to polysilicon.

Further, in the base substrate 200 after the completion of polishing, it is preferable that recessed defects in the stopper 2 are small. In this regard, according to the polishing method of the present embodiment, occurrence of the recessed defects can be suppressed.

As described above, according to the polishing method of the embodiment, unevenness on the surface of the base substrate 100 is eliminated, and thus a smooth surface is obtainable over the entire surface of the base substrate 200.

Further, in the base substrate 200 after the completion of polishing, it is preferable that a dishing amount (recess amount) 6, which is a value obtained by subtracting a thickness 5 of the insulating portion 3 in the concave portion (trench portion) from a depth (height from the bottom of the concave portion of the substrate 1 to the surface of the stopper 2) 4 of the concave portion (trench portion) is small. In this regard, according to the polishing method of the present embodiment, the dishing amount 6 can be reduced in some cases. For example, by using the polishing liquid in which the pH (x) of the polishing liquid and the content (y) of the polymer compound B satisfy the relation of y≥0.33x−1.7, there is a tendency that the dishing amount 6 can be reduced. Furthermore, by using the polishing liquid in which the pH (x) of the polishing liquid and the content (y) of the polymer compound B satisfy the relation of y≥0.33x−1.7, and satisfy 5.0≤x≤6.0 and 0.05≤y≤0.35, there is a tendency that the dishing amount 6 can be reduced. The dishing amount 6 can be obtained by measuring a level difference between the stopper 2 and the insulating portion 3 on the surface of the base substrate after polishing, for example, using a stylus type level difference measuring apparatus (trade name: P16 manufactured by KLA-Tencor Corporation).

The polishing liquid of the present embodiment is not limited to be applied to polishing of the base substrate (for example, polishing of an insulating film or the like formed on a semiconductor substrate) as described in the aforementioned embodiment, and can also be applied to polishing of inorganic insulating materials such as silicon oxide, glass, and silicon nitride that are formed on circuit boards with predetermined wirings; and materials mainly containing Al, Cu, Ti, TiN, W, Ta, TaN, or the like.

The base substrate polished by the polishing method of the present embodiment can be used in manufacturing of various electronic components. Examples of electronic components provided with the base substrate (substrate) polished by the polishing method of the present embodiment include not only semiconductor elements but also optical glass such as photomask lens prisms; inorganic conductive films such as ITO; integrated optical circuits composed of glass and crystalline materials; optical switching elements; optical waveguides; end faces of optical fibers; optical single crystals such as scintillators; solid laser single crystals; sapphire substrates for blue laser LED; semiconductor single crystals such as SiC, GaP, and GaAs; glass substrates for magnetic disk; and magnetic heads. In these electronic components, each layer is polished by the polishing liquid of the present embodiment so that high integration can be achieved and excellent characteristics can be exhibited.

EXAMPLES

Hereinafter, the present invention will be described by means of Examples, but the present invention is not limited to these Examples.

Preparation of Abrasive Grains 40 kg of commercially available cerium carbonate hydrate was placed in an alumina container and fired at 830° C. for 2 hours in air to obtain 20 kg of yellowish-white powder. The powder was subjected to phase identification by an X-ray diffraction method, by which it was identified as cerium oxide. 20 kg of cerium oxide powder thus obtained was subjected to dry grinding using a jet mill to obtain cerium oxide powder containing cerium oxide particles.

Preparation of Water-Soluble Compound A

Polyoxyethylene polyoxypropylene glycol ether (trade name: EPAN manufactured by DKS Co. Ltd.) was prepared as a water-soluble compound A-1. Further, 2,4,7,9-tetramethyl-5-decyne-4,7-diol (acetylene-based diol) was prepared as a water-soluble compound A-2. Further, polyethylene glycol (trade name: PGE-4000 manufactured by DKS Co. Ltd.) was prepared as a water-soluble compound A-3.

Preparation of Polymer Compound B

Polyacrylic acid having a weight average molecular weight of 2,500 (value in terms of sodium polyacrylate) was prepared as a polymer compound B-1. Further, ammonium polyacrylate having a weight average molecular weight of 8,000 was prepared as a polymer compound B-2.

Preparation of Basic pH Adjusting Agent

As a basic pH adjusting agent 1, ammonia (25% by mass aqueous solution) was prepared. Further, as a basic pH adjusting agent 2, imidazole was prepared.

Preparation of Test Water for Evaluation

Blanket wafers having no pattern structure formed thereon described below were prepared as a first test wafer for evaluation and a second test wafer for evaluation.

First test wafer for evaluation: a wafer (p-TEOS wafer) having a silicon oxide film with a thickness of 1,000 nm formed using a TEOS-plasma CVD method on a silicon (Si) substrate (diameter: 200 mm)

Second test wafer for evaluation: a wafer having a polysilicon film on a silicon (Si) substrate (diameter: 200 mm)

A wafer having the following pattern structures formed thereon was prepared as a third test wafer for evaluation.

Convex (active portion) structure: a structure in which a TEOS film, a polysilicon film, and a TEOS film are laminated in this order on a silicon (Si) substrate, and the thickness of the uppermost TEOS film is 600 nm Concave (trench portion) structure: a structure in which a TEOS film is laminated on a silicon (Si) substrate, and the thickness of the TEOS film is 600 nm Pattern layout: SEMATCH864

Preparation of CMP Polishing Liquid

Example 1

200.0 g of the cerium oxide powder prepared as described above and 795.0 g of deionized water were mixed, then 5 g of ammonium polyacrylate aqueous solution (an aqueous solution containing 40% by mass of the polymer compound B-2) was added, and the resulting mixture was dispersed under ultrasonication while being stirred, thereby obtaining a cerium oxide dispersion. The dispersion under ultrasonication was performed at an ultrasonic wave frequency of 400 kHz for a dispersion time of 20 minutes.

Thereafter, 1 kg of the cerium oxide dispersion was put and left to stand still in a 1 L container (height: 170 mm), and then sedimentation classification was performed. After a classification time of 15 hours, the supernatant at a depth of 130 mm from the surface of the water was drawn by a pump. The supernatant cerium oxide dispersion thus obtained was diluted with deionized water to have a solid content of 5% by mass, thereby obtaining a cerium oxide slurry containing cerium oxide and the polymer compound B-2.

To measure the average particle diameter (D50) of cerium oxide in the cerium oxide slurry, the slurry was diluted to have a transmittance (H) of 60 to 70%, as measured with respect to He-Ne laser, thereby obtaining a measurement sample. The D50 of the measurement sample was measured with a laser diffraction type particle size distribution meter (manufactured by HORIBA, Ltd., trade name: LA-920, refractive index: 1.93, light source: He-Ne laser, absorption: 0), and as a result, the value of D50 was 150 nm.

The cerium oxide slurry prepared above, the water-soluble compound A-1, the polymer compound B-1, and pure water were mixed to obtain a mixed liquid, and then the basic pH adjusting agent 1 was added to the obtained mixed liquid to adjust the pH to 5.7. Thus, a polishing liquid of Example 1 was obtained. Incidentally, the respective components were blended so that the content (unit: % by mass) based on the total mass of the polishing liquid and the content (unit: mol/kg) of the pH adjusting agent became values shown in Table 1. Further, the pH of the polishing liquid was measured according to the following.

Measuring instrument: pH meter (trade name: Model PH81 manufactured by Yokogawa Electronic Corp.)

Measuring method: After two points calibration was performed using a phthalate pH buffer solution (pH: 4.01) and a neutral phosphate pH buffer solution (pH: 6.86) as standard buffer solutions, an electrode of the pH meter was put into the polishing liquid, and the pH stabilized after 2 minutes or longer at 25° C. was then measured. At this time, both the liquid temperatures of the standard buffer solutions and the polishing liquid were set to 25° C.

Example 2

A polishing liquid of Example 2 was prepared in the same manner as in Example 1, except that the water-soluble compound A-2 was used instead of the water-soluble compound A-1.

Examples 3 to 12 and Comparative Examples 1 and 2

Polishing liquids of Examples 3 to 12 and Comparative Examples 1 and 2 were prepared in the same manner as in Example 1, except that the water-soluble compound A-3 was used instead of the water-soluble compound A-1 and the blending amounts of the respective components were adjusted so that the contents of the respective component in the polishing liquid became values shown in Tables 1 to 3.

Example 13

A polishing liquid of Example 13 was prepared in the same manner as in Example 1, except that the water-soluble compound A-3 was used instead of the water-soluble compound A-1, the basic pH adjusting agent 2 was used instead of the basic pH adjusting agent 1, and the blending amounts of the respective components were adjusted so that the contents of the respective component in the polishing liquid became values shown in Table 2.

Comparative Example 3

A polishing liquid of Comparative Example 3 was prepared in the same manner as in Example 1, except that the water-soluble compound A-1 was not used and the blending amounts of the respective components were adjusted so that the contents of the respective component in the polishing liquid became values shown in Table 3.

Evaluation

Evaluation of Polishing Selectivity

The first test wafer for evaluation and the second test wafer for evaluation were respectively polished using a polishing apparatus (trade name: Mirra manufactured by Applied Materials, Inc.). Specifically, first, the test wafer for evaluation was set in a holder mounting an adsorption pad for attachment of the substrate. Next, a polishing cloth made of a porous urethane resin (Model No. IC1000 manufactured by Rohm & Haas Nitta Co.) was attached to a polishing platen of the polishing apparatus. The holder was put on the polishing platen while the surface on which the insulating film (silicon oxide film) or the polysilicon film, which is a film to be polished, is disposed faces downward, and a machining load was set to 3.6 psi (about 25 kPa). Next, while the CMP polishing liquid was added dropwise onto the polishing platen at a speed of 200 mL/min, the polishing platen and the test wafer for evaluation were rotated at 93 min$^{-1}$ and 87 min$^{-1}$, respectively, and the test wafer for evaluation was polished for 60 seconds. The wafer after polishing was thoroughly washed with pure water and then dried.

The film thicknesses of the silicon oxide film and the polysilicon film before and after polishing were measured using a light-interference film thickness meter (trade name: RE-3000 manufactured by Dainippon Screen Mfg. Co., Ltd.), and the polishing rates (unit: nm/min) of the silicon oxide film and the polysilicon film in the blanket wafer were calculated by dividing an average value of a change amount in film thickness by the polishing time. The ratio r of the polishing rate of the silicon oxide film to the polishing rate of the polysilicon film (the polishing rate of the silicon oxide film/the polishing rate of the polysilicon film) was obtained from the obtained polishing rates.

The polishing rate ratio r was evaluated based on the following evaluation criteria. In the case of the evaluation being A or B, it is evaluated that the polishing rate ratio is excellent. The results are shown in Tables 1 to 3.

A: r>50
B: 10≤r≤50
C: r<10

Recessed Defect Evaluation

Using an optical microscope (trade name: DSX-510 manufactured by Olympus Corporation), the center of the second test wafer for evaluation after polishing obtained in the polishing rate evaluation was photographed at five places with ×20 magnification objective lens setting. Then, the number of recessed defects per captured image was counted, and an average value of five images was obtained as the number of recessed defects (unit: defects/field of view).

Figure 2:
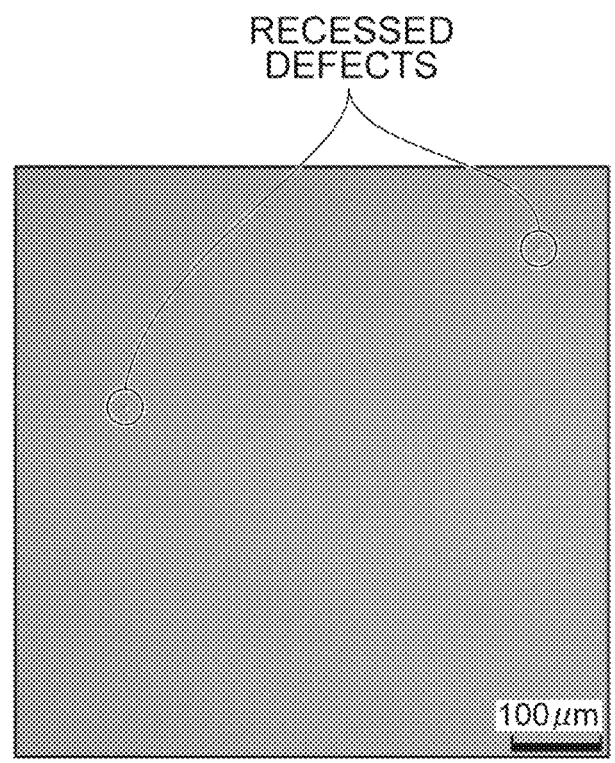
FIG. 2 shows an observation image of a surface after polishing in recessed defect evaluation of Example.
Figure 3:
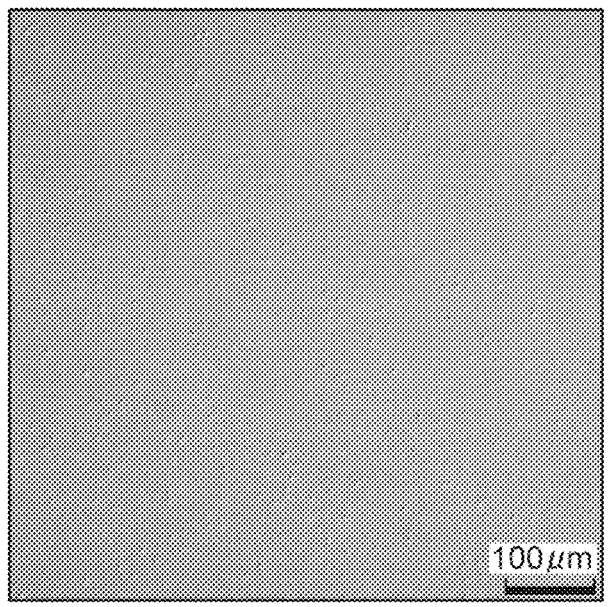
FIG. 3 shows an observation image of a surface after polishing in recessed defect evaluation of Comparative Example.

The effect of suppressing recessed defects was evaluated based on the following evaluation criteria. In the case of the evaluation being A or B, it is evaluated that the effect of suppressing recessed defects is excellent. The results are shown in Tables 1 to 3. Further, as an example, the recessed defect observation image of Example 5 and the recessed defect observation image of Comparative Example 1 are shown in FIGS. 2 and 3.

A: Number of recessed defects≤10
B: 10<Number of recessed defects<21
C: Number of recessed defects≥21

Dishing Evaluation

The third test wafer for evaluation was polished in the same manner as in polishing of the first test wafer for evaluation and the second test wafer for evaluation in the polishing rate evaluation, except that polishing was performed until the polysilicon on the convex portion in a layout portion, which has a width of the convex portion/the concave portion of 50 um/50 um, was exposed.

The recess amount (dishing amount, unit: nm) of the concave portion in the layout portion, which has a width of the convex portion/the concave portion of 50 um/50 um, at the center of the third test wafer for evaluation after polishing was measured using a stylus type level difference measuring apparatus (trade name: P16 manufactured by KLA-Tencor Corporation).

The dishing suppression effect was evaluated based on the following evaluation criteria. In the case of the evaluation being A or B, it is evaluated that the dishing suppression effect is excellent. The results are shown in Tables 1 to 3.

A: Dishing amount≤30 nm
B: 30 nm<Dishing amount<41 nm
C: Dishing amount≥41 nm

TABLE 1

| Composition | Unit | Example 1 | Example 2 | Example 3 | Example 4 | Example 5 | Example 6 | Example 7 |
|---|---|---|---|---|---|---|---|---|
| Cerium oxide | % by mass | 1.0 | 1.0 | 1.0 | 1.0 | 1.0 | 1.0 | 1.0 |
| Water-soluble compound A-1 | % by mass | 0.05 | — | — | — | — | — | — |
| Water-soluble compound A-2 | % by mass | — | 0.05 | — | — | — | — | — |
| Water-soluble compound A-3 | % by mass | — | — | 0.10 | 0.10 | 0.10 | 0.10 | 0.10 |
| Polymer compound B-1 | % by mass | 0.20 | 0.20 | 0.20 | 0.20 | 0.20 | 0.15 | 0.15 |
| Polymer compound B-2 | % by mass | 0.01 | 0.01 | 0.01 | 0.01 | 0.01 | 0.01 | 0.01 |
| Basic pH adjusting agent 1 | % by mass<br>mol/kg | 0.011<br>$6.46 \times 10^{-3}$ | 0.011<br>$6.46 \times 10^{-3}$ | 0.013<br>$7.63 \times 10^{-3}$ | 0.011<br>$6.46 \times 10^{-3}$ | 0.0075<br>$4.40 \times 10^{-3}$ | 0.0057<br>$3.35 \times 10^{-3}$ | 0.004<br>$2.35 \times 10^{-3}$ |
| Basic pH adjusting agent 2 | % by mass<br>mol/kg | —<br>— | —<br>— | —<br>— | —<br>— | —<br>— | —<br>— | —<br>— |
| pH of polishing liquid | | 5.7 | 5.7 | 6.0 | 5.7 | 5.3 | 5.5 | 5.3 |
| Polishing rate ratio R | | A | A | A | B | B | A | A |
| Recessed defects | | B | B | B | B | A | A | A |
| Dishing | | B | B | C | B | A | B | A |

TABLE 2

| Composition | Unit | Example 8 | Example 9 | Example 10 | Example 11 | Example 12 | Example 13 |
|---|---|---|---|---|---|---|---|
| Cerium oxide | % by mass | 1.0 | 1.0 | 1.0 | 1.0 | 1.0 | 1.0 |
| Water-soluble compound A-1 | % by mass | — | — | — | — | — | — |
| Water-soluble compound A-2 | % by mass | — | — | — | — | — | — |
| Water-soluble compound A-3 | % by mass | 0.10 | 0.10 | 0.10 | 0.10 | 0.10 | 0.10 |
| Polymer compound B-1 | % by mass | 0.10 | 0.10 | 0.10 | 0.05 | 0.05 | 0.10 |
| Polymer compound B-2 | % by mass | 0.01 | 0.01 | 0.01 | 0.01 | 0.01 | 0.01 |
| Basic pH adjusting agent 1 | % by mass | 0.0055 | 0.004 | 0.0013 | 0.002 | 0.0003 | — |
| | mol/kg | $3.23 \times 10^{-3}$ | $2.35 \times 10^{-3}$ | $7.63 \times 10^{-3}$ | $1.17 \times 10^{-3}$ | $1.76 \times 10^{-4}$ | — |
| Basic pH adjusting agent 2 | % by mass | — | — | — | — | — | 0.0029 |
| | mol/kg | — | — | — | — | — | $4.26 \times 10^{-4}$ |
| pH of polishing liquid | | 5.7 | 6.0 | 5.0 | 5.7 | 5.0 | 5.0 |
| Polishing rate ratio R | | A | A | A | A | A | A |
| Recessed defects | | A | A | A | A | A | A |
| Dishing | | C | C | A | C | A | A |

TABLE 3

| Composition | Unit | Comparative Example 1 | Comparative Example 2 | Comparative Example 3 |
|---|---|---|---|---|
| Cerium oxide | % by mass | 1.0 | 1.0 | 1.0 |
| Water-soluble compound A-1 | % by mass | — | — | — |
| Water-soluble compound A-2 | % by mass | — | — | — |
| Water-soluble compound A-3 | % by mass | 0.10 | 0.10 | — |
| Polymer compound B-1 | % by mass | 0.30 | 0.30 | 0.10 |
| Polymer compound B-2 | % by mass | 0.01 | 0.01 | 0.01 |
| Basic pH adjusting agent 1 | % by mass | 0.04 | 0.023 | 0.0013 |
| | mol/kg | $2.35 \times 10^{-2}$ | $1.35 \times 10^{-2}$ | $7.63 \times 10^{-4}$ |
| Basic pH adjusting agent 2 | % by mass | — | — | — |
| | mol/kg | — | — | — |
| pH of polishing liquid | | 6.5 | 6.0 | 5.0 |
| Polishing rate ratio R | | A | B | C |
| Recessed defects | | C | C | A |
| Dishing | | C | B | — |

As shown in Tables 1 to 3 and FIGS. 2 and 3, it was confirmed that by adjusting the content of the basic pH adjusting agent to be less than $1.3 \times 10^{-2}$ mol/kg in the polishing liquid, which contains abrasive grains containing cerium, the water-soluble compound A, and the polymer compound B, the ratio of the polishing rate of the insulating material to the polishing rate of the stopper material is excellent and the occurrence of recessed defects in the stopper can be suppressed.

Figure 4:
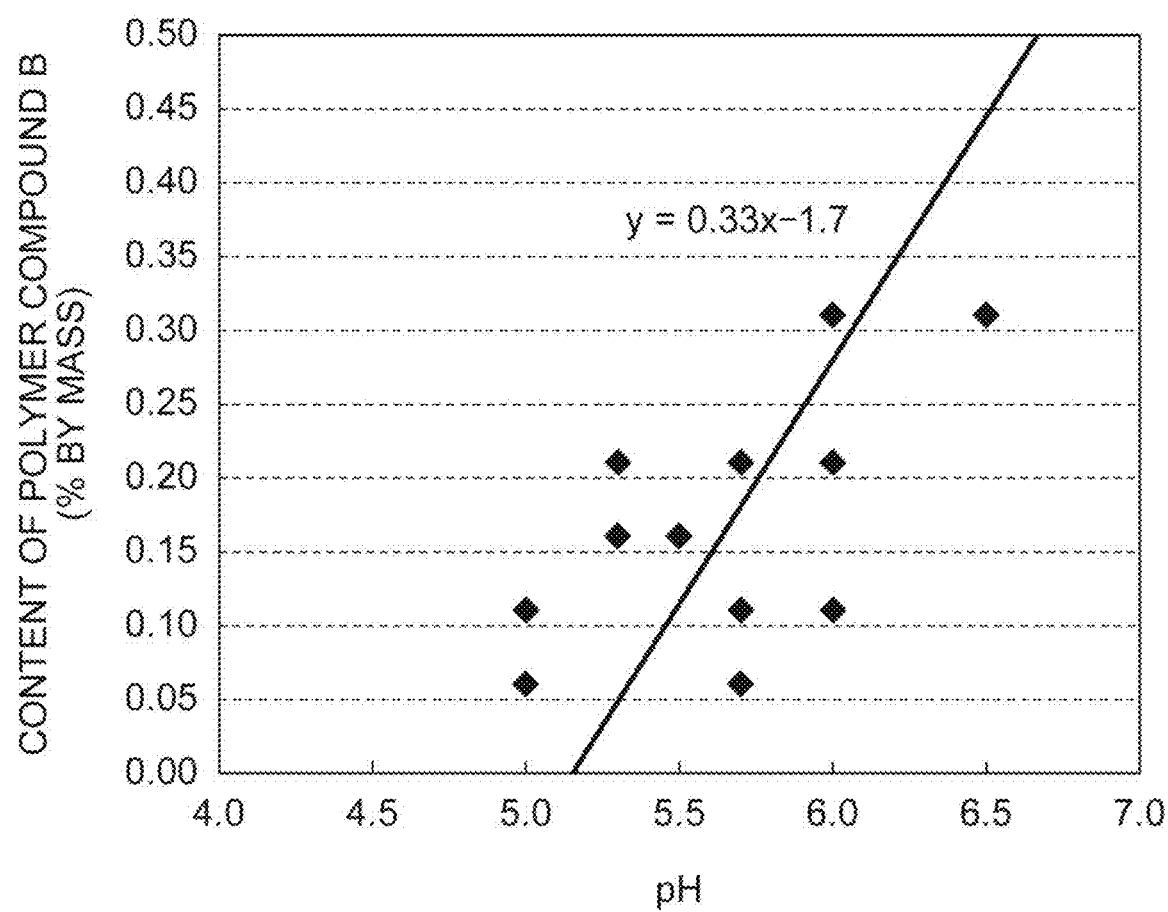
FIG. 4 is a graph showing a relation between pH and a content of a polymer compound B in polishing liquids of Examples and Comparative Examples.

FIG. 4 is a graph showing a relation between pH and a content of a polymer compound B in polishing liquids of Examples and Comparative Examples. The x-axis of the graph shown in FIG. 4 indicates the pH of the polishing liquid and the y-axis indicates the content of the polymer compound B (unit: % by mass). As shown in Tables 1 to 3 and FIG. 4, it was confirmed that, in the polishing liquid in which the pH (x) of the polishing liquid and the content (y) of the polymer compound satisfy the relation of y≥0.33x−1.7, the dishing suppression effect is obtainable.

REFERENCE SIGNS LIST

1: substrate, 2: stopper, 3: insulating portion, 100: base substrate.

The invention claimed is:

1. A polishing liquid used for removing a part of an insulating portion of a base substrate, which includes a substrate, a stopper provided on one surface of the substrate, and the insulating portion provided on a surface of the stopper opposite to the substrate, by CMP to expose the stopper, the polishing liquid comprising:

abrasive grains containing cerium; a nonionic water-soluble component A comprising one or more of an acetylene-based diol and a polyalkylene glycol, an anionic polymer component B comprising one or more of a homopolymer of acrylic acid, a homopolymer of methacrylic acid, a copolymer of acrylic acid and methacrylic acid, and salts thereof; a basic pH adjusting agent; and water, wherein a content of the basic pH adjusting agent ranges from $1.0 \times 10^{-4}$ mol/kg to less than $1.3 \times 10^{-2}$ mol/kg based on the total mass of the polishing liquid.

2. The polishing liquid according to claim 1, wherein the abrasive grains contain cerium oxide.

3. The polishing liquid according to claim 1, wherein a pH of the polishing liquid is 6.0 or less.

4. The polishing liquid according to claim 1, wherein a pH of the polishing liquid is 5.0 or more.

5. The polishing liquid according to claim 1, wherein a content of the anionic polymer component B is 0.35% by mass or less based on the total mass of the polishing liquid.

6. The polishing liquid according to claim 1, wherein a content of the anionic polymer component B is 0.05% by mass or more based on the total mass of the polishing liquid.

7. The polishing liquid according to claim 1, wherein when a pH of the polishing liquid is designated as x and a content of the anionic polymer component B based on the total mass of the polishing liquid is designated as y, a relation of y≥0.33x−1.7 is satisfied.

8. The polishing liquid according to claim 1, wherein a content of the water-soluble component A is 0.005 to 0.3% by mass based on the total mass of the polishing liquid.

9. The polishing liquid according to claim 1, wherein a content of the basic pH adjusting agent ranges from $1.0 \times 10^{-4}$ mol/kg to less than $5.0 \times 10^{-3}$ mol/kg based on the total mass of the polishing liquid.

10. The polishing liquid according to claim 1, wherein a content of the abrasive grains is 0.2 to 5% by mass based on the total mass of the polishing liquid.

11. The polishing liquid according to claim 1, further comprising at least one organic acid component comprising one or more of an organic acid and an organic acid salt.

12. The polishing liquid according to claim 11, wherein the at least one organic acid component comprises at least two organic acids.

13. The polishing liquid according to claim 1, wherein the stopper contains at least one stopper material comprising one or more of polysilicon, amorphous silicon, and single-crystal silicon.

14. A polishing liquid set comprising:
constituent components of the polishing liquid according to claim 1 stored while being divided into a first liquid and a second liquid, the first liquid containing the abrasive grains and water, the second liquid containing the water-soluble component A, the anionic polymer component B, and water.

15. A polishing method comprising a step of removing a part of the insulating portion of the base substrate by CMP using the polishing liquid according to claim 1 to expose the stopper.

16. The polishing liquid according to claim 1, wherein the component A comprises polyethylene glycol and polypropylene glycol.

17. The polishing liquid according to claim 1, wherein the stopper comprises polysilicon.

18. The polishing liquid according to claim 1, wherein a pH of the polishing liquid is 4.0 or more and 6.0 or less.

19. A polishing liquid comprising:
abrasive grains comprising cerium;
a nonionic water-soluble component A comprising one or more of an acetylene-based diol and a polyalkylene glycol;
an anionic polymer component B comprising one or more of a homopolymer of acrylic acid, a homopolymer of methacrylic acid, a copolymer of acrylic acid and methacrylic acid, and salts thereof;
a basic pH adjusting agent comprising one or more of ammonia and imidazole, a content of the basic pH adjusting agent being less than $1.3 \times 10^{-2}$ mol/kg based on the total mass of the polishing liquid; and
water.

20. The polishing liquid according to claim 19, wherein when a pH of the polishing liquid is designated as x and a content of the anionic polymer component B based on the total mass of the polishing liquid is designated as y, a relation of $y \geq 0.33x - 1.7$ is satisfied.

* * * * *